United States Patent
Yokoi et al.

(10) Patent No.: US 8,124,185 B2
(45) Date of Patent: Feb. 28, 2012

(54) METHOD FOR MANUFACTURING ORGANIC FUNCTIONAL LAYER AND ORGANIC FUNCTIONAL DEVICE, AND ORGANIC FUNCTIONAL DEVICE MANUFACTURING APPARATUS

(75) Inventors: Hajime Yokoi, Tokyo (JP); Yuko Abe, Tokyo (JP); Ryo Shoda, Tokyo (JP); Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 741 days.

(21) Appl. No.: 12/211,789

(22) Filed: Sep. 16, 2008

(65) Prior Publication Data
US 2009/0074974 A1  Mar. 19, 2009

(30) Foreign Application Priority Data
Sep. 18, 2007 (JP) ................... 2007-240687

(51) Int. Cl.
*B05D 3/10* (2006.01)
(52) U.S. Cl. ...................... 427/335; 427/340
(58) Field of Classification Search .......... None
See application file for complete search history.

(56) References Cited

U.S. PATENT DOCUMENTS

| | | | | |
|---|---|---|---|---|
| RE21,045 E | * | 4/1939 | Bright | 427/335 |
| 6,348,443 B1 | * | 2/2002 | Hanada et al. | 510/407 |
| 2003/0012869 A1 | * | 1/2003 | Kido | 427/58 |
| 2006/0052268 A1 | * | 3/2006 | Artuphel et al. | 510/411 |

FOREIGN PATENT DOCUMENTS

| | | |
|---|---|---|
| JP | 09-097679 | 4/1997 |
| JP | 2002-020795 * | 1/2002 |
| JP | 2002-313567 | 10/2002 |
| JP | 2003-017261 | 1/2003 |
| JP | 2004-216554 | 8/2004 |
| JP | 2005-026000 | 1/2005 |
| JP | 2005-100894 | 4/2005 |
| JP | 2005-235574 | 9/2005 |
| JP | 2006-261026 | 9/2006 |
| WO | WO 01/70506 | 9/2001 |
| WO | WO 03/098696 | 11/2003 |

OTHER PUBLICATIONS

Sakai, Jun, "Organic Solar Cells by Printing Process", May 11, 2005, pp. 20-27, (including partial translation and "Statement of Concise Explanation").

* cited by examiner

*Primary Examiner* — Erma Cameron
(74) *Attorney, Agent, or Firm* — Squire Sanders (US) LLP

(57) ABSTRACT

A method for manufacturing an organic functional layer includes the steps of: forming a coated film of an organic functional material by applying a coating liquid to a substrate by a printing method, the coating liquid including an organic functional material dissolved or dispersed in a first organic solvent; and bringing the coated film into contact with vapor or liquid of a second organic solvent, the second organic solvent having the following properties: chemically non-active; the second organic solvent can be mixed with the first solvent; the second organic solvent can not substantially dissolve the organic functional material; and a vapor pressure of the second organic solvent is higher than that of the first organic solvent at a room temperature.

12 Claims, 12 Drawing Sheets

METHOD FOR MANUFACTURING ORGANIC FUNCTIONAL LAYER AND ORGANIC FUNCTIONAL DEVICE, AND ORGANIC FUNCTIONAL DEVICE MANUFACTURING APPARATUS

CROSS REFERENCE

This application is based upon and claims the benefit of priority from the prior Japanese Patent Application No. 2007-240687, filed on Sep. 18, 2007, and is based upon the prior Japanese Patent Application No. 2007-006820, filed Jan. 16, 2007, the entire contents of which applications are incorporated herein by reference.

BACKGROUND OF THE INVENTION

1. Field of the Invention

The present invention is related to an apparatus for manufacturing an organic film which is to be applied to a substrate. In addition, the present invention is a method for manufacturing an organic functional device such as an organic electroluminescence device (hereinafter, called an organic EL), an organic solar cell and an organic transistor, the method including a drying process.

2. Description of the Related Art

In late years, development of an organic functional device such as an organic EL device, an organic solar cell and an organic transistor using an organic functional material has been active in order to obtain a flexible or thin and light electronic member. It is necessary that a pattern of an organic functional layer having a thickness of, generally, several tens—several thousands nm is formed on a substrate in the case of manufacturing these organic functional devices.

Low molecular materials and polymeric materials are examples of organic functional materials. Generally, as for low molecular materials, thin film can be formed by a resistance heating vapor deposition method. A mask with minute patterns is used at this time, and patterns are formed. In a manufacturing method with the use of this method, upsizing of a substrate can diminish the accuracy of the patterning. In addition, in a vapor deposition method, a source of a vapor is usually a small aperture such as a pinhole of a boat or a crucible. Therefore, it is difficult to form a uniform layer on an upsized substrate. In addition, it is often that a vapor deposition method is performed under high vacuum. Therefore, a large-sized vacuum apparatus is necessary.

On the other hand, a method of forming a thin film by a wet process with a coating liquid (an ink) obtained by dispersing or dissolving the organic functional material into a solvent has been attempted. As the wet coating method for the thin film formation, spin coating, bar coating, projection coating, dip coating, and the like are known. It is considered that the thin film of high definition pattern is most effectively formed by a printing process that is capable of achieving excellent color coding and patterning. (For example, see patent documents 1, 2 and 3, and non-patent document 1.)

A method for manufacturing an organic functional device by a printing method is very effective. Especially, in the case where a high molecular material is used, a pattern of a flat and uniform organic functional layer can be easily formed on a substrate. However, since an organic functional layer printed on a substrate includes a solvent, a drying step for removing the solvent is necessary. Examples of proposed methods for the drying step include a vacuum oven method (for example, see patent document 4.), a heat drying method (for example, see patent document 5.) and a pressurized heat drying method (for example, see patent document 6.).

However, in the case where an organic functional device is manufactured by forming an organic functional layer on a substrate by a printing method such as a relief printing method (a flexo printing method), an intaglio offset printing method, a relief printing type reverse offset printing method, an ink jet printing method and an intaglio printing method, a solvent having a very high boiling point at atmospheric pressure (ex. more than 150 degrees Celsius) is often used in order to prevent a drying of a coating liquid during a printing process. It is impossible that a solvent can not be sufficiently removed from an organic functional layer by a heat drying under an atmospheric pressure, a reduced pressure and an increased pressure. Further, there is a problem that characteristics of an organic functional device are reduced or degraded due to the high boiling point solvent remaining in an organic functional layer, compared with a case where a high boiling point solvent is not used. It is thought that such degradation is caused by chemical reaction of a remaining high boiling point solvent with an organic functional material or an inorganic electrode. In addition, the following phenomenon may occur: after an organic functional layer is formed, an inorganic film etc. is formed by a vacuum method such as a vapor deposition method or a sputtering method; at this time, a chamber is polluted with a little vaporized high boiling point solvent remaining in an organic functional layer; thereafter, an inorganic film formed in the same chamber may badly influenced.

In addition, in the case where an organic functional layer is heated to a high temperature in order to remove a solvent (a first organic solvent: hereinafter, it may be called as a remaining solvent.) remaining in an organic functional layer by a sufficient drying, materials of an organic functional device may be degraded. In addition, further, in the case where a film made of a plastic is used for a substrate in order to make a light and flexible device, there is a problem in which change of form or degradation of a substrate occurs by a high heat. Besides, in the case where there is oxygen or water with an organic functional layer in heating, there is a problem in which oxygen or water chemically reacts with an organic functional layer, thereby characteristics of device are degraded. Especially, oxygen easily reacts with a double bond part of a π electron system molecule which is frequently used as an organic functional layer. Therefore, in the case where an organic functional layer is dried at a high temperature, drying is often performed in a non-active atmosphere such as nitrogen or argon.

Therefore, the present invention was made by considering the above-mentioned facts. The present invention provides a method and an apparatus for manufacturing an organic film by which a high performance organic functional device can be manufactured. In the method and the apparatus, degradation of characteristics of an organic functional device due to a removal of a remaining solvent does not occur in the case where an organic functional layer is manufactured by a printing method. Further, the present invention provides a method for manufacturing an organic EL device, an organic solar cell and an organic transistor, in which a method for manufacturing an organic film provided by the present invention is used.

[Patent document 1] JP-A-2003-17261
[Patent document 2] JP-T-2003-527955
[Patent document 3] JP-T-2005-531134
[Patent document 4] JP-A-H09-97679
[Patent document 5] JP-A-2002-313567
[Patent document 6] JP-A-2005-26000
[Non-patent document 1] 5th time of 142nd committee [of organic materials] C sectional meeting (organic optoelectronics) study group data for information science Organic thin film solar cell by a printing process (20-27 pages)

SUMMARY OF THE INVENTION

A method for manufacturing an organic functional layer including steps of: forming a coated film of an organic functional material by applying a coating liquid to a substrate by a printing method, the coating liquid including an organic functional material dissolved or dispersed in a first organic solvent; and bringing the coated film into contact with vapor or liquid of a second organic solvent, the second organic solvent having the following properties: chemically non-active; the second organic solvent can be mixed with the first solvent; the second organic solvent can not substantially dissolve the organic functional material; and a vapor pressure of the second organic solvent is higher than that of the first organic solvent at a room temperature.

In these drawings, 101 is a transparent substrate; 102 is a transparent conductive layer; 103 is an organic functional layer; 103a is a charge transport layer; 103b is an organic light emitting layer or an active layer; 105 is an electrode layer; 201 is a substrate; 202 is an inorganic insulating layer; 203 is a source electrode; 204 is a drain electrode; 205 is an organic semiconductor layer; 206 is a gate insulating layer; 207 is a gate electrode; 301 is an ink tank; 302 is an ink chamber; 303 is an anilox roll; 304 is an ink layer; 305 is a plate cylinder; 306 is a relief printing plate; 307 is a substrate to be printed; 308 is a flat base; 401 is a substrate holder; 402 is an ultrasonic bath; 403 is an ultrasonic oscillator; 404 is a rinse tank; 405 is a vapor bath; 406 is a heater; 407 is a cooler; 408 is a drying solvent (liquid); 409 is a drying solvent (vapor); 501 is a substrate to which an organic functional layer is applied; 502 is a substrate cooler; 503 is a chamber; 601 is a substrate installing part; 602 is a cold liquid discharging part; 603 is a drying solvent (cool liquid); 604 is a drain valve; 701 is a gas discharge valve; 702 is a gas supply valve; 703 is a check valve; 801 is a substrate—cassette; 802 is a steam generator; 901 is a mist generating bath; 902 is an ultrasonic atomizer; 903 is a drying solvent (mist); 904 is a blower; 905 is a suction port; 906 is an exhaust port; 907 is a drying solvent recovery tank; 1001 is a drying solvent spraying device; 1002 is an air blower; 1003 is a moving base; 1101 is a pressure measuring equipment; 1102 is a drying solvent tank; 1201 is a substrate carrying rail; 1202 is a substrate box before processing; 1203 is an infrared ray heater; 1204 is infrared ray; and 1205 is a substrate box after processing.

DETAILED DESCRIPTION OF THE INVENTION

Hereinafter, a method for manufacturing an organic functional layer and an organic functional device, and an organic functional device manufacturing apparatus of one embodiment of the present invention are described in detail. In addition, in embodiments described below, an identical constituent element is provided with an identical symbol. Further, explanations overlapping between embodiments are omitted.

Figure 1:
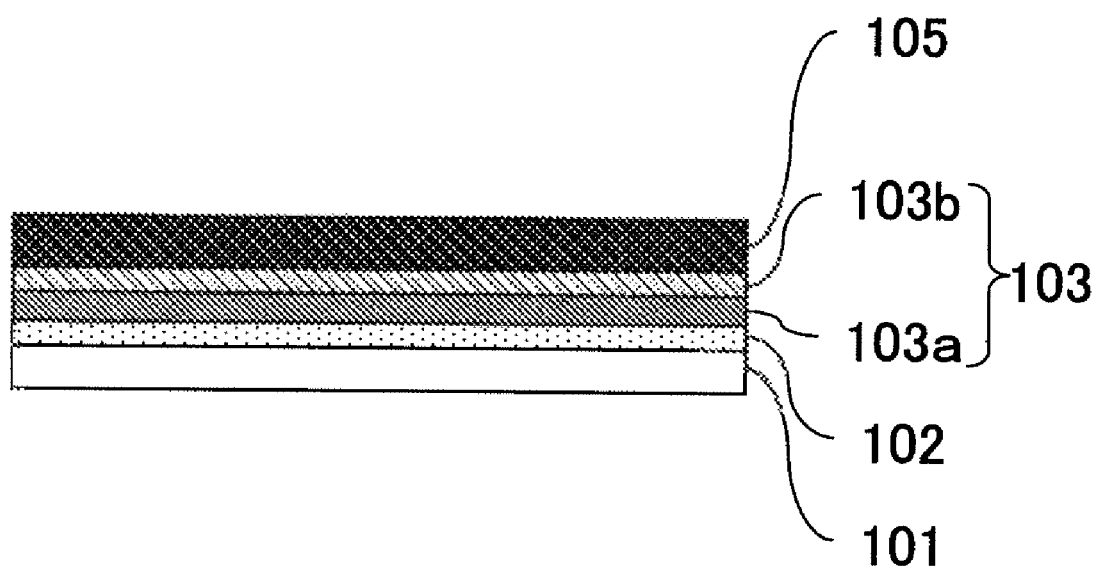
FIG. 1 is a cross-sectional view of one example of an organic EL device or an organic solar cell of one embodiment of the present invention.

An organic functional layer of the present invention is a charge transport layer 103a, an organic light emitting layer or an active layer 103b of FIG. 1. As mentioned in "DESCRIPTION OF THE RELATED ART", a printing method is superior in forming a fine pattern of an organic functional layer. Further, an important point in manufacturing of an organic functional device of the present invention is how a solvent is removed from an organic functional layer which is easily damaged by heat and is weak in oxygen and water, and is how an organic functional layer is dried. Therefore, first of all, manufacturing processes common to respective functional devices are described below. This manufacturing process includes processes from "forming an organic functional layer by a printing method" to "drying it".

(A Method for Forming an Organic Functional Layer)

A method for forming an organic functional layer of one embodiment of the present invention is described below referring to FIG. 3.

Figure 3:
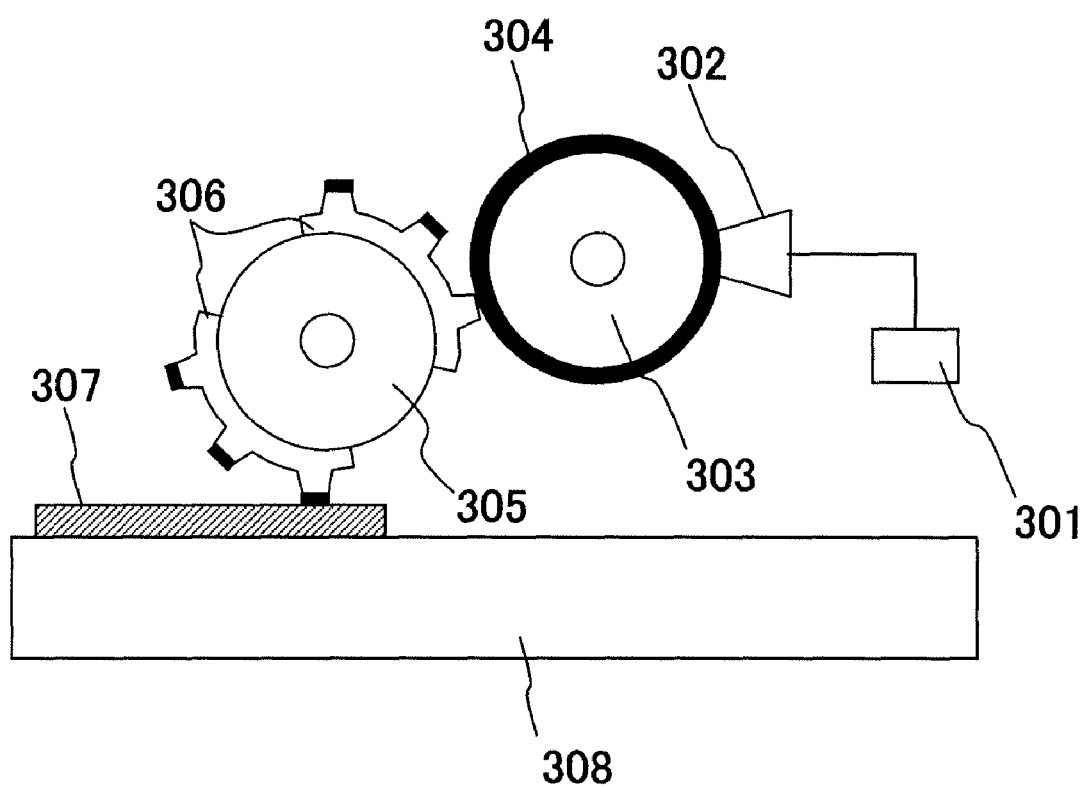
FIG. 3 is a schematic diagram of a printing apparatus used in one embodiment of the present invention.

FIG. 3 shows a schematic diagram of a relief printing apparatus which pattern-prints a coating liquid (an ink) comprising an organic functional material on a substrate by a relief printing method. This relief printing apparatus has an ink tank 301, an ink chamber 302, an anilox roll 303 and a plate cylinder 305 on which a relief printing plate 306 with convex parts is equipped. An ink in which an organic functional material is dissolved or dispersed in an organic solvent (a first organic solvent) is taken to an ink tank 301. The ink is sent into an ink chamber 302 from an ink tank 301. An anilox roll 303 makes contact with an ink feed section of an ink chamber 302, and it is rotatably supported.

According to the rotation of an anilox roll 303, ink layer 304 supplied on an anilox roll face becomes uniform. At this time, an excess ink can be removed by a non-illustrated doctor knife. This ink layer 304 transfers on relief parts (projection parts) of a plate 306 mounted on a printing cylinder 305 which is rotationally driven in proximity to an anilox roll 303. A substrate 307 is transported to a printing position of a flat base 308 by a transporting means that are not illustrated. And ink on relief parts of a plate 306 is printed on a substrate 307.

A photosensitive resin plate is used for a relief printing plate 306. For photosensitive resin plates, there are a solvent developing type and a water developing type. In the case of a solvent developing type photosensitive resin plate, an organic solvent is used as a liquid developer of an exposed resin plate. In the case of a water-developable photosensitive resin plate, water is used as a liquid developer for an exposed resin plate. A solvent developing type photosensitive resin plate shows resistance to a water type ink. A water-developable photosensitive resin plate shows resistance to an organic solvent system ink. Therefore, the type of a resin plate should be selected according to a property of an printing ink.

Here, in the case of relief printing method with a coating liquid (an ink) in which an organic functional material is dissolved or dispersed in an organic solvent, a solvent of a high boiling point is used for an organic solvent (a first organic solvent). This is because a coating liquid ink is gradually dried during processes in which an ink is transferred from an ink chamber 302 (an ink supplier) to an anilox roll 303, and is transferred from an anilox roll 303 to a relief printing plate 306. In the case where an ink on a convex part of a relief printing plate 306 is transferred to a substrate to be printed 307, there is a problem in which a coating liquid ink is not transferred to a substrate to be printed 307 due to drying of a coating liquid ink. That is, a high boiling point solvent is used for a first organic solvent of a coating liquid ink in order to prevent a coating liquid ink from drying during a printing process.

In addition, in the case where an organic functional layer is formed by an intaglio offset printing method and a relief printing type reverse offset printing method, a high boiling point solvent is use for a first organic solvent which is used for making a coating liquid of an organic functional material. An intaglio offset printing method includes a step of supplying an ink from an ink supplier to an intaglio printing plate, a step of transferring an ink from an intaglio printing plate to an elastic silicone blanket and a step of transferring an ink pattern on a blanket to a substrate. In the case of an intaglio offset printing using a low boiling point solvent, a coating liquid dries during a printing step, thereby an ink is not transferred from a blanket to a substrate.

A relief printing type offset printing method includes a step of supplying an ink from an ink supplier to the entire surface of a blanket, a step of forming an ink pattern on a blanket by transferring an ink on a blanket to a convex part of a removing plate and a step of transferring an ink pattern on a blanket to a substrate. In the case of a relief printing type offset printing method using a low boiling point solvent, a coating liquid dries during a printing process, thereby an ink is not transferred from a blanket to a substrate.

As mentioned above, it is necessary to use a high boiling point solvent as a first organic solvent in order to prevent a coating liquid from drying during a printing process, in the case where an organic functional layer is formed by forming a pattern of a coating liquid including an organic functional material on a substrate by a printing method.

In addition, in the case where an organic functional layer is formed on a substrate by an ink-jet printing method, a high boiling point solvent is used though it is not necessary to consider drying of a coating liquid during a printing process. An ink-jet printing method is as follows: an ink pattern is formed in a region sectioned by banks by dropping a coating liquid from an ink-jet nozzle at an ink-jet head. In an ink-jet printing method, in the case where an organic functional layer is formed by using a low boiling point solvent, a film thickness of an organic functional layer largely changes in a region sectioned by banks due to rapid drying of a coating liquid dropped on a substrate. Therefore, an organic functional layer of a uniform thickness can not be obtained. Therefore, in the case where an ink-jet printing method is used as a printing method, it is also necessary to use a high boiling point solvent as a first organic solvent.

As mentioned above, in a method for forming an organic functional layer, if an organic functional layer is formed by a printing method, a high boiling point solvent is necessary to be used as a first organic solvent. On the other hand, there is a problem in which the use of a high boiling point solvent causes a quality reduction of an organic functional device such as reductions of luminance and light emitting life due to a remaining solvent. Further, the use of a high boiling point solvent causes damage in an organic functional layer by heating with oxygen/water during a process of drying a solvent. Then, in a method for manufacturing an organic functional layer of one embodiment of the present invention, such problems are solved by methods described below.

(A Method for Drying an Organic Functional Layer)

A method for drying an organic functional layer in a method for manufacturing an organic functional layer of one embodiment of the present invention is described below.

As mentioned above, in the case where an organic functional layer is formed by a printing method, a high boiling point solvent is necessary to be used as a first solvent. Therefore, in a drying by heat, it takes long time for a remaining solvent (a first solvent) to be removed from a coated film of an organic functional layer. In addition, a remaining solvent can not be always removed sufficiently. Further, the exposure of an organic functional device to a high temperature causes damage/degradation of an organic functional device, and further causes a reduction of characteristics of an organic functional device.

Then, a method for drying an organic functional layer in a method for manufacturing an organic functional layer of one embodiment of the present invention does not cause degradation of an organic functional layer while a remaining solvent can be sufficiently removed, even if a high boiling point solvent is used as a first organic solvent.

One embodiment of the present invention has the following feature in order to remove sufficiently a solvent of a coating liquid without degradation of an organic functional layer: a coated film is dried by a step of exchanging a remaining solvent (a first organic solvent) for a drying solvent (a second organic solvent) and a step of removing this drying solvent from an organic functional layer, thereby an organic functional layer is formed. In particular, the following methods can be used: dipping a substrate in a drying solvent in order to perform washing and rinse of the substrate, thereafter taking the substrate out of a drying solvent in order to remove a drying solvent; exchanging a remaining solvent by making a cooled substrate absorb a drying solvent vapor; spraying a drying solvent to a substrate by a spray etc.; further exchanging a remaining solvent by making a cooled substrate absorb a drying solvent vapor of a high volatile property. In addition, if the following method for cooling a substrate is used, construction of a simple manufacturing apparatus of small-footprint is possible: a fluid including a drying solvent cooled less than a boiling point of a drying solvent is discharged to a back surface of a substrate with a coated film or a substrate installing part in contact with the back surface. Detail explanation is explained below with an explanation of a manufacturing method of the present invention.

A drying solvent which can be usable for exchanging solvents should satisfy the following conditions: first of all, a drying solvent is necessary to be a chemically inactive solvent which does not react with an organic layer material part of an organic functional layer. A solvent including many fluorine atoms is usually chemically inactive with any organic compounds. In addition, a drying solvent is necessary to have a property in which a dried thin film (an organic functional layer thin film) of an organic functional material is not dissolved or peeled. It is not preferable that an organic functional layer film is dissolved or peeled in the case where a substrate with an organic functional layer film is dipped in a drying solvent. Therefore, in particular, the following case is preferable as a standard in which dissolving and peeling do not occur: percentage of change is less than 1% between a surface roughness Ra (JIS B0601-1994) of an organic functional layer immediately after dipping and that after 24 hours passed from dipping; and a weight of an organic functional layer dissolved in a drying solvent after 24 hours passed is less than 0.1% of a weight of an organic functional layer after a drying process.

Secondary, a drying solvent is necessary to be mixes with a remaining solvent and does not dissolve an organic layer material part of an organic functional layer. Many of materials which are used for an organic functional material are generally a $\pi$ electron system material having an aromatic ring structure. Such a compound is easily dissolved in an aromatic system solvent such as toluene and xylene. In addition, there is a case where a $\pi$ electron system material mixed with an ionic substituent group or a dopant is used. In the case, an organic functional material is easily dissolved in a solvent of a high polarity. A solvent including many fluorine atoms hardly dissolves a film made of the above-mentioned organic functional material, while the solvent including many fluorine atoms can be mixed with a solvent such as the above fluorine system solvent or alcohol. Therefore, a fluorine system solvent satisfies the above-mentioned conditions as a drying solvent. Thereby, a fluorine system solvent does not dissolves an organic functional layer while a remaining solvent included in an organic functional material ink can be exchanged for a drying solvent.

Thirdly, it is preferable that a vapor pressure of a drying solvent at a room temperature (a surrounding temperature in a treatment process) be higher than a vapor pressure of a first organic solvent (a remaining solvent) included in a coating liquid. A drying solvent has preferably a higher vapor pressure. It is necessary that a drying solvent on a substrate be quickly removed after a remaining solvent in an organic functional layer is exchanged. In particular, it is preferable that a vapor pressure of a drying solvent in a drying process be 5000 Pa or more in view of Examples etc. described below. If a volatile property of a drying solvent is sufficiently high, a special drying apparatus as a vacuum drying machine or an inactive gas atmosphere is not necessary. Thereby, reduction of cost of manufacturing apparatuses or shortening of manufacturing time is possible.

In addition, fourthly, it is preferable that a surface tension of a drying solvent be low so that a drying solvent penetrates to an organic functional layer, thereby a remaining solvent in an organic functional layer is efficiently exchanged for a drying solvent. In particular, it is preferable that a surface tension of a drying solvent be 25 mN/m or less in view of Example etc. described below.

Fluorine atom has high electronegativity, small volume, and has a unique character of making a carbon have strong uniting. Accordingly, a solvent including many fluorine atoms has the feature of a extremely weak intermolecular gravitation with other compounds by the fluorine compound, highly volatile property compared with a hydrocarbon solvent having the same molecular weight and a very low surface tension.

A compound having 5 or more fluorine atoms per one molecule can be preferably used for a drying solvent. To be concrete, fluoroether such as methyl nona fluorobutyl ether, ethyl nona fluorobutyl ether and tridecafluoro hexyl methylic ether, fluoroalkane such as 1,1,2,2,3,3,4-heptafluoro cyclopentane, 1,1,1,3,3-pentafluoro butane and Octa fluoro-2-butene, fluoroalkene, fluoroaryl such as hexafluorobenzene, pentafluorobenzene, octafluorotoluene and 1,3-bis(trifluoromethyl) benzene, and fluoroalcohol such as 1,1,1,3,3,3-hexafluoro-2-propanol can be preferably used. That is, in the present invention, ether, alkanes, alkene, aryl and alcohols including 5 or more fluoro groups (fluorine groups) in one molecule as a drying solvent can be preferably used.

In the case where a drying solvent is used having properties explained above, in a method for manufacturing an organic functional layer of one embodiment of the present invention, an organic functional layer is not degraded and a remaining solvent can be surely and efficiently removed, even if a high boiling point solvent is used as a first organic solvent.

Therefore, in a method for manufacturing an organic functional device using a method for manufacturing an organic functional layer, quality reduction of an organic functional device does not occur, thereby a high quality organic functional device can be obtained. Here, quality reduction of an organic functional device is, for example, damage of an organic functional layer by heating coexistent with oxygen/water, or reductions of luminance and light emitting life due to a remaining solvent.

(Apparatus for Manufacturing an Organic Functional Layer)

Specific examples of an organic functional manufacturing apparatus of embodiments of the present invention, in which the above-mentioned method for manufacturing an organic functional layer, are described based on figures. Respective apparatus shown in the figures are examples of an organic functional device manufacturing apparatus of the present invention, thereby the present invention is not limited to these.

Figure 4:
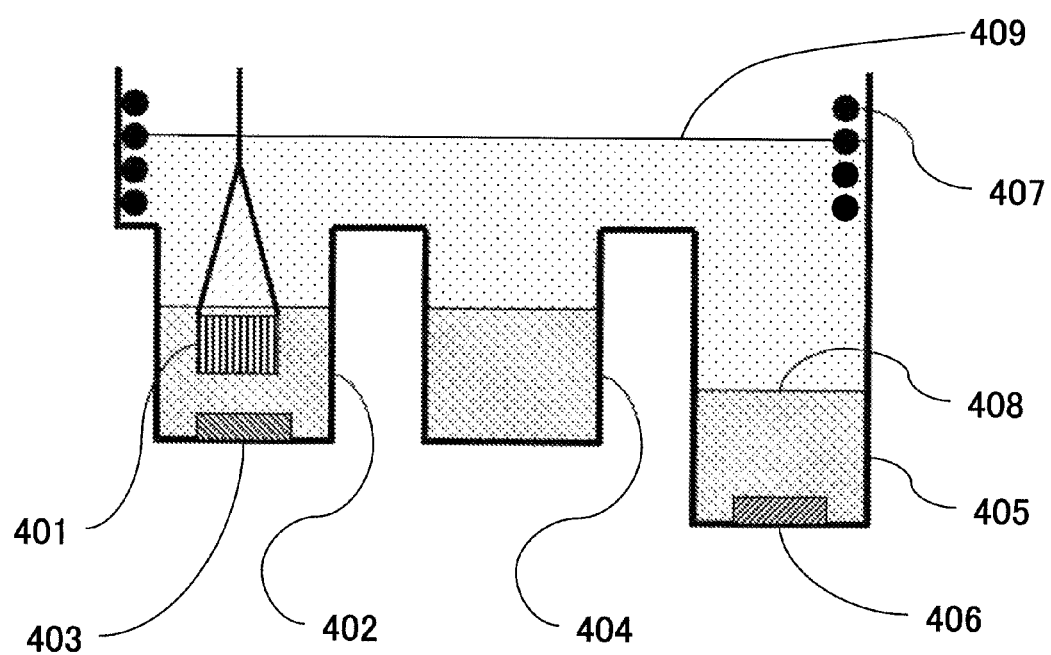
FIG. 4 is a schematic diagram of a drying equipment in an organic functional device manufacturing apparatus of one embodiment of the present invention.

FIG. 4 shows one example of a manufacturing apparatus in which dipping is performed by using a rinse tank filled with a drying solvent liquid. The apparatus shown in FIG. 4 has a substrate holder 401 for fixing a substrate, an ultrasonic bath 402 filled with a drying solvent, a rinse tank 404 filled with a drying solvent, a cooler 407, a vapor bath 408 having means for generating a drying solvent vapor. A drying process using this apparatus shown in FIG. 4 is described below.

At first, a substrate to which an organic functional layer is applied is arranged on a substrate holder 401. The substrate is washed in an ultrasonic bath 402 filled with a drying solvent. As mentioned above, a drying solvent is as follows: a drying solvent can be mixed with a remaining solvent; a drying solvent is a chemically inactive solvent which does not dissolve an organic functional layer material part of an organic functional layer; and a vapor pressure of a drying solvent in a drying process is higher than a vapor pressure of a remaining solvent.

A substrate can be beforehand preliminarily dried. In addition, a substrate holder 401 can be swung in an ultrasonic bath 402 in order to wash and dry a substrate uniformly. Output or frequency of ultrasonic wave and a temperature of a drying solvent in an ultrasonic bath 402 are arbitrary. In addition, the number of ultrasonic bathes shown in FIG. 4 is one. However, the number of ultrasonic bathes is not limited to this. In the case where a functional organic layer applied to a substrate is easily peeled off, an ultrasonic bath is not necessary.

Next, a substrate holder 401 is dipped in a rinse tank 404 filled with a drying solvent. A drying solvent in a rinse tank 404 can be agitated, and a substrate holder 401 can be swung in a rinse tank 404. A temperature of a drying solvent in a rinse tank 404 is preferably low. However, if the temperature is too low, in the case where a substrate holder 401 is taken out of a rinse tank 404, a dew formation of water etc. other than a drying solvent may occur on a surface of a substrate. Therefore, the temperature is preferably about 10-25 degrees Celsius. If the temperature of a drying solvent in a rinse tank 404 is reduced, raise of a temperature of a substrate in a next vapor bath is suppressed. Thereby, efficiency of washing and drying a substrate is improved. Time for dipping a substrate holder in a rinse tank 404 is arbitrary. In addition, at this time, it is preferable that frequency of a ultrasonic wave be high. In particular, 500 kHz-3 MHz is preferable. In the case where an ultrasonic wave of a high frequency is used, an organic functional layer on a substrate is hardly damaged.

Next, a substrate holder 401 is arranged in a vapor bath. The vapor bath has a heater 406 at its lower part. The heater 406 is dipped in a drying solvent 408. A drying solvent is heated by the heater, thereby an upper part of a vapor bath 405 is filled with its vapor 409. This vapor is cooled by a cooling part 407 arranged at an upper part of a vapor bath 405. Thereby, this vapor flows down to a lower part. A vapor of a drying solvent is absorbed by a surface of a substrate on a substrate holder 401. The vapor is cooled by a substrate, thereby dew is formed, and the dew flows down to a lower part of a vapor bath 405. At this time, a remaining solvent in an organic functional layer flows down with a drying solvent. When a temperature of a substrate becomes same as a boiling point of a drying solvent, dew formation on a surface of a substrate stops. Therefore, a substrate holder 401 is taken up out of a vapor bath 405. The following processes can be adopted: the taken up substrate holder is dipped in a rinse tank 404 or cooled by a cool air; thereafter, the substrate holder is again moved in a vapor bath 405; and the substrate is washed and dried.

In the case where another layer is formed on the substrate which is dried by the above-mentioned method, if the substrate is moved from a current place to a next processing place in which both places are sealed from a surrounding area, the another layer formation can be performed in a state that the substrate is not attached by an undesirable material such as a dust. For example, after an organic light emitting layer of an organic EL device is dried, the substrate is moved inside a sealed space, thereby the substrate is moved to a vapor deposition apparatus in order to form a cathode. In this case, short-circuit by an attaching material or dark spot formation can be prevented.

FIGS. 5-8 are manufacturing apparatuses. In the apparatuses, a vapor of a drying solvent is in contact with a cooled substrate, in which dew is formed. Thereby, a remaining solvent is exchanged for a drying solvent.

Figure 5:
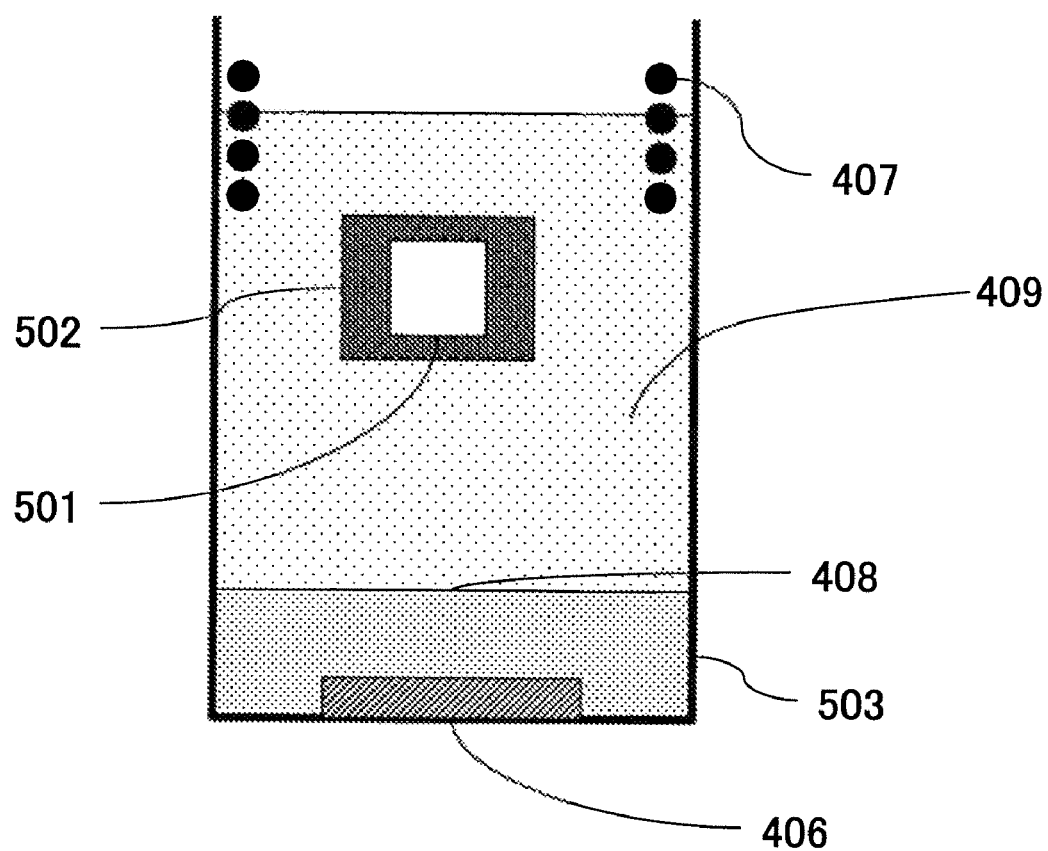
FIG. 5 is a schematic diagram of a drying equipment in an organic functional device manufacturing apparatus of one embodiment of the present invention.

A manufacturing apparatus shown in FIG. 5 has a drying solvent (a hot liquid) 408 and a heater at a lower part of a chamber 503. Thereby, a drying solvent (a vapor) 409 is generated. By using this apparatus, a remaining solvent in an organic functional layer is exchanged and removed. An apparatus shown in FIG. 5 has a substrate cooler 502. A vapor of a drying solvent is generated from a chamber 503 by heating using a heater 406. The generated vapor is in contact with a substrate with an organic functional layer coated film. At this time, dew of a drying solvent is formed on a surface of a substrate and the dew is absorbed by a substrate since a temperature of a surface of a substrate is cooled by a substrate cooler to a dew point of a drying solvent or less. Therefore, exchanging a remaining solvent in an organic functional layer can be performed very efficiently. Placing and fixing a substrate vertically can allow dew of a solvent to drop in a chamber. Thereby, the dropped solvent can be reused as a drying solvent. In addition, a substrate cooler 502 is supported by a non-illustrated tool. Thereby, the cooler can be put in or put out of a chamber 503 at an arbitrary timing.

Any substrate cooler 502 can be used if it can appropriately cool a substrate 501. A heat exchanger in which a fluid such as water or air can flow, a peltiert device, a metal block having a large heat capacity and the like can be used. Any cooling temperature of substrate 501 is acceptable if the cooling temperature is less than a boiling point of a drying solvent. However, if the cooling temperature is too low, dew formation of water etc. other than a drying solvent may occur on a surface of a substrate when a substrate cooler 410 and a substrate 501 are taken out of a chamber 503. Therefore, it is preferable that a temperature of a substrate cooler 410 be a dew point of a drying solvent or less, and further be 10-25 degrees Celsius. However, in the case of an atmosphere where exchanging for nitrogen are performed in an apparatus and the apparatus is filled with a dried nitrogen, since a dew point of water is low, a temperature of a substrate cooler 410 can be further low.

In addition, as for a temperature of a chamber 503 generating a vapor 408 of a drying solvent, the chamber 503 is necessary to be heated so that a vapor of a drying solvent is at least generated. However, it is preferable that the temperature of a chamber 503 be a boiling point of a remaining solvent or less so that a remaining solvent removed from an organic functional layer coated layer is prevented from being absorbed by a substrate again.

Same as the above, as for a temperature of a heater 406 generating a vapor of a drying solvent, the heater 406 is necessary to be heated so that a vapor of a drying solvent is at least generated. However, as mentioned above, it is preferable that a heating temperature of the heater 409 be less than a boiling point of a remaining solvent so that a remaining solvent removed from an organic functional layer coated film is prevented from being again absorbed by a substrate. More preferably, (a boiling point of a remaining solvent—the heating temperature) is preferably higher than 40 degrees Celsius. In this case, a drying solvent is polluted with a remaining solvent included in an organic functional layer by contact of a drying solvent with a substrate 501. However, in the case where a drying solvent is again in contact with a substrate 501, a drying solvent is distilled and purified. Therefore, pollution of a substrate 501 does not occur.

As described above, if an apparatus shown in FIG. 5 is used, a substrate is cooled by a substrate cooler 502 inside a chamber 503. Thereby, stop of dew formation due to raise of a temperature of a substrate is prevented. Therefore, exposure to a vapor is performed for an arbitrary time. In addition, a substrate is not necessary to be put in a rinse tank. Thereby, a high boiling point solvent or dust included in a drying solvent in a rinse tank is prevented from attaching again to a substrate. Further, since a rapid cooling by a rinse tank is not performed, there is no possibility that a film quality of an organic functional layer changes by a rapid change of a temperature.

Figure 6:
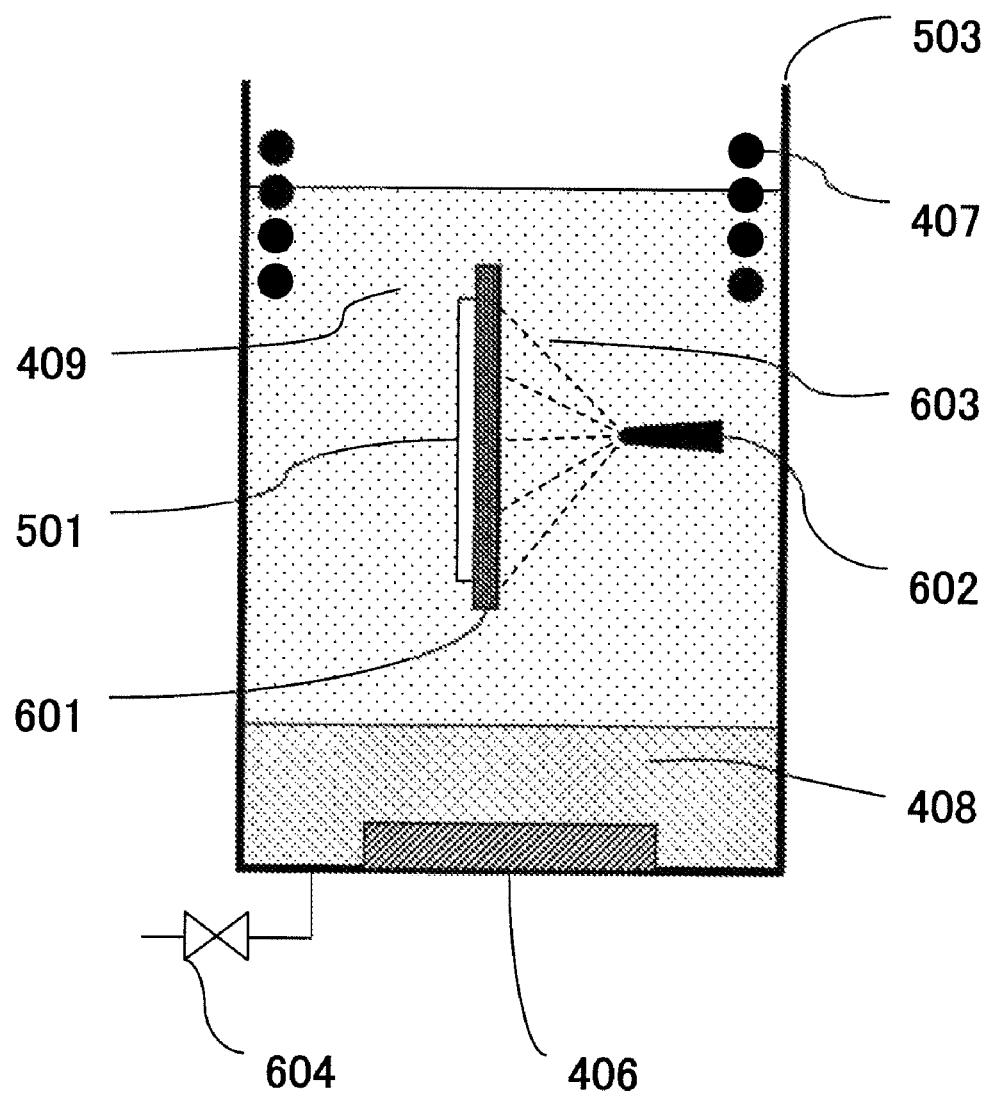
FIG. 6 is a schematic diagram of a drying equipment in an organic functional device manufacturing apparatus of one embodiment of the present invention.

A drying apparatus shown in FIG. 6 has a drying solvent (a hot liquid) 408 and a heater 406 at a lower part of a chamber 503, same as the apparatus shown in FIG. 5, in which the drying apparatus shown in FIG. 6 generates a drying solvent (a vapor) 409. Therefore, means for generating a vapor is constituted by a lower part of a chamber 503 and a heater 406. When a drying solvent (a hot liquid) is supplied to the means, a vapor of a drying solvent can be generated. A drying solvent (a vapor) 409 is cooled by a cooler 407 which is arranged on an inside wall at an upper part of a chamber 503. Thereby, diffusion of a drying solvent to out of a chamber is controlled.

In addition, a chamber is equipped with a drain valve 604 from which an unnecessary drying solvent can be arbitrarily ejected. After the polluted drying solvent is ejected form a drain valve, the polluted drying solvent can be regenerated by a non-illustrated a solvent regenerating apparatus. A substrate on which a coated film of an organic functional layer is formed is fixed to a substrate installing part 601 inside a chamber 503. A substrate installing part 601 is arranged at a part directly above the means of generating a vapor. In addition, as for a shape of a substrate installing part 601 shown in FIG. 6, the substrate installing part 601 perfectly covers a back surface of a substrate 501. However, if a substrate installing part can fix a substrate 501, a substrate installing part of any shape is available. Only a fringe of substrate 501 can be supported by a substrate installing part. In addition, a cool liquid discharging part 602 which can supply a drying solvent (a cool liquid) 603 is arranged inside a chamber 503. A drying solvent (a cool liquid) 603 discharged from the cool liquid discharging part 602 was discharged to a back surface of a substrate or a substrate installing part. Thereby, a substrate can be cooled. According to this method, a substrate can be continuously exposed to a drying solvent (a vapor) for an arbitrary time and be dried where stop of dew formation by a raise of a temperature of a substrate is not considered.

For example, a spray nozzle can be used for a cool liquid discharging part 602. However, any types of a cool liquid discharging part 602 can be used, if an necessary amount of a drying solvent for cooling a substrate 501 to less than a boiling point of a drying solvent can be discharged to a necessary area. In addition, a two-fluid type nozzle can be used for a spray nozzle in which an inactive gas such as nitrogen mixed with a drying solvent (a cool liquid) 603 can be discharged.

A process of drying an organic functional coated film by a drying apparatus shown in FIG. 6 is described below.

A substrate 501 on which an organic functional coated film is formed is arranged on a substrate installing part 601. A substrate 501 is arranged on a substrate installing part 601 so that a back surface of a substrate 501 with an organic functional coated film is in contact with a cool liquid discharging part 602 described below. At this time, a chamber 503 can be beforehand filled with a drying solvent (a vapor) 408, or after a substrate 501 is arranged, a drying solvent (a vapor) 409 can be generated. This vapor is absorbed by a surface of a substrate 501, and dew is formed by cooling of the vapor by a substrate 501 cooled by a drying solvent (a cool liquid) 603 discharged from a cool liquid discharging part 602. Thereafter, the dew flows down to a lower part of a chamber 503. At this time, a remaining solvent in an organic functional layer flows down with a drying solvent. At a time when a temperature of a substrate 501 becomes same as a boiling point of a drying solvent, dew formation on a surface of a substrate 501 stops. In order to start a dew formation again, a substrate 501 is cooled in which a drying solvent (a cool liquid) 603 discharged from a cool liquid discharging part 602 is in contact with a back surface of a substrate 501 with an organic functional coated film or a substrate installing part 601 on the back surface. The discharged drying solvent (a cool liquid) 603 flows down to a lower part of a chamber 503 and is mixed with a drying solvent (a hot liquid) 408. Thereafter, the mixed drying solvent is heated to become a drying solvent (a vapor) 409. A drying solvent can be continuously discharged at any time during a drying process of a substrate 501. A drying solvent can be intermittently discharged. On the other hand, as for a remaining solvent which flows down to a lower part of a chamber 503 with a drying solvent, since a temperature of a heater is lower than a boiling point of the remaining solvent, the remaining solvent does not become a vapor and remains in a drying solvent (a hot liquid) 408.

As mentioned above, a back surface of a substrate 501 with an organic functional coated film or a substrate installing part 601 on the back surface is cooled by a drying solvent (a cool liquid) 603. Therefore, an organic functional layer is not degraded, and a remaining solvent can be efficiently and surely removed.

Figure 7:
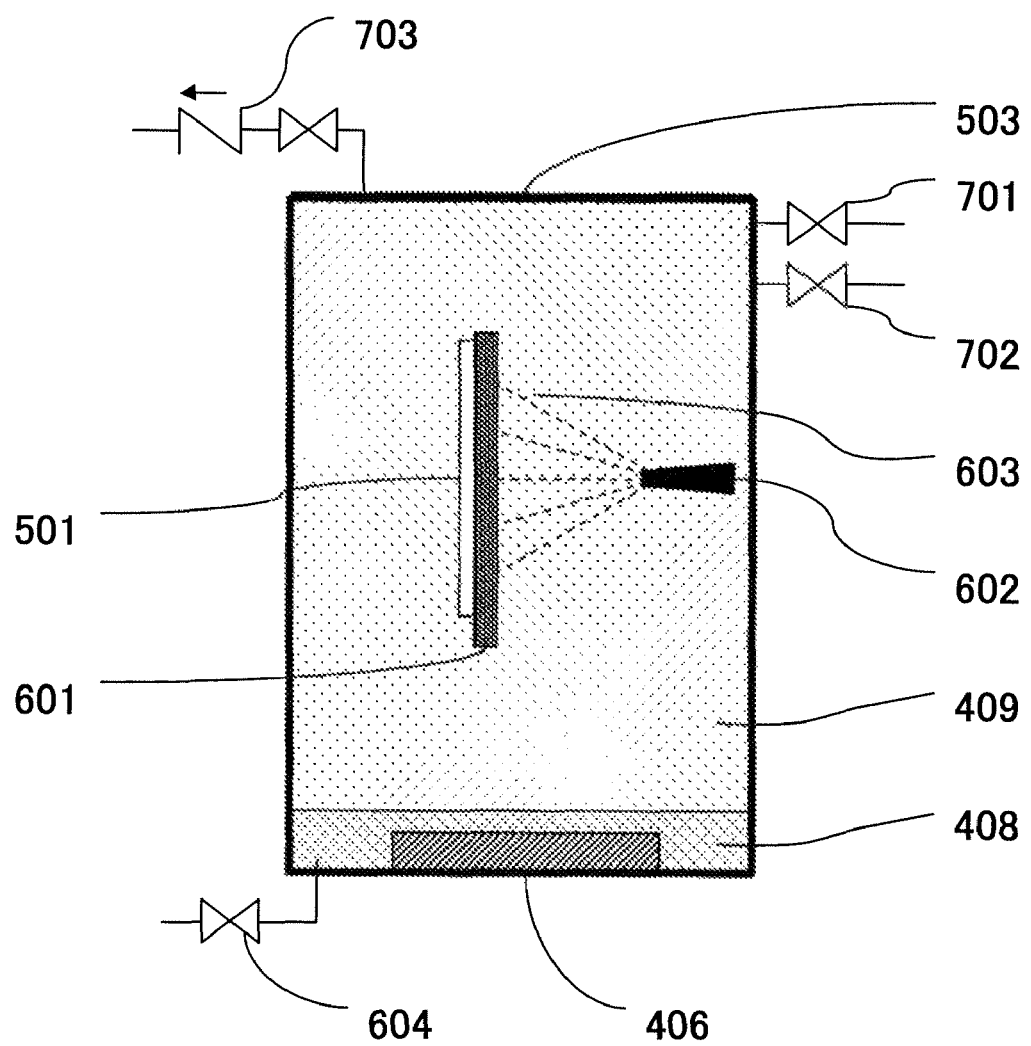
FIG. 7 is a schematic diagram of a drying equipment in an organic functional device manufacturing apparatus of one embodiment of the present invention.

In an apparatus shown in FIG. 7, a chamber is a sealed type, and a gas in a chamber can be exchanged for an inactive gas such as nitrogen. An inlet valve 702 and an exhaust valve 701 are arranged to a chamber so that an inactive gas such as nitrogen is supplied in a chamber and exhausting is performed. In addition, since a chamber 503 is a sealed type, it is not necessary that a gas is again cooled by adding a cooler to a chamber 503. Therefore, a cooler is not arranged on a side wall at an upper part of a chamber 503. Constitutions other than the above-mentioned constitution are same as an apparatus shown in FIG. 6. Since a chamber 503 is a sealed type, if an inactive gas such as nitrogen is supplied and drying is performed, it is possible that an organic functional layer is exposed to an atmospheric air during a drying processing. Supplying of an inactive gas are performed simultaneously at the time when the above-mentioned drying solvent (a cool liquid) 603 is discharged from a cool liquid discharging part 602. Therefore, this apparatus has a merit. That is, since drying is performed inside an inactive gas atmosphere, degradation of an organic functional layer can be perfectly avoided, in which the degradation occurs by an organic functional layer absorbing oxygen or water included in an atmospheric air or an organic functional layer reacting with oxygen or water included in an atmospheric air. In addition, since a back surface of a substrate 501 with an organic functional coated film or a substrate installing part 601 on the back surface is cooled by a drying solvent (a cool liquid) 603, an organic functional layer is not degraded, and a remaining solvent is efficiently and surely removed.

Figure 8:
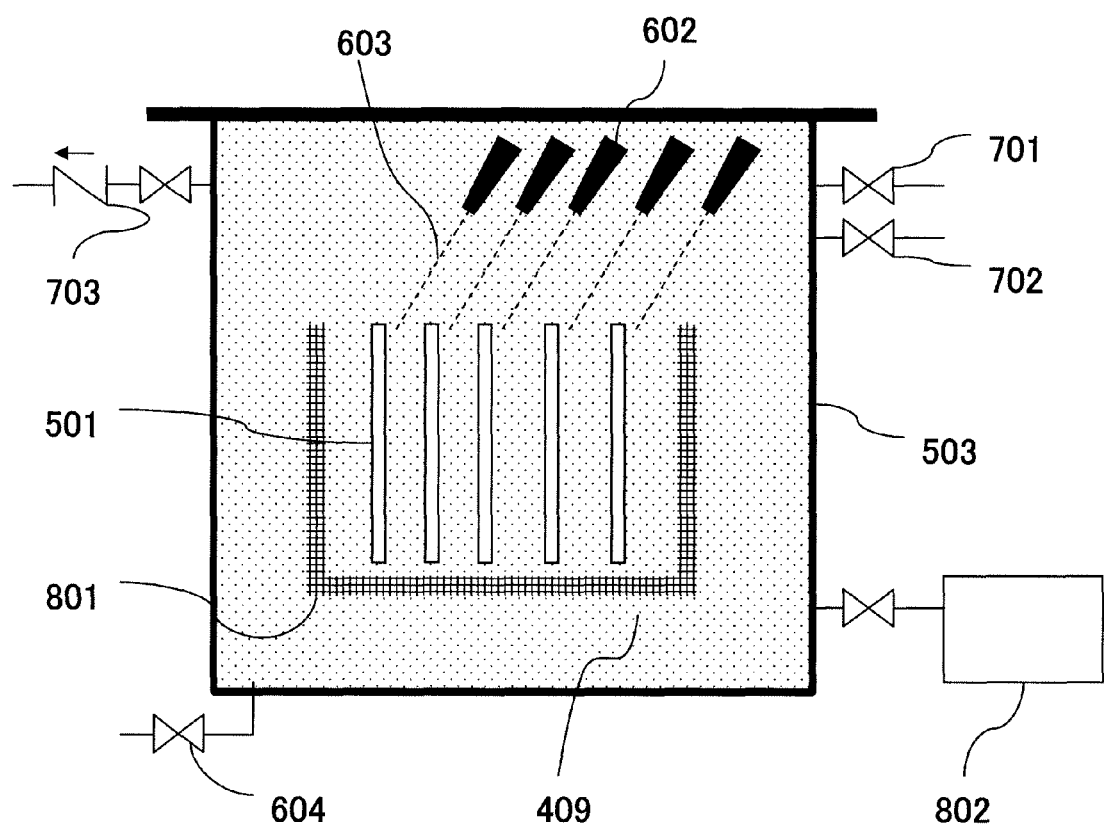
FIG. 8 is a schematic diagram of a drying equipment in an organic functional device manufacturing apparatus of one embodiment of the present invention.

In an apparatus shown in FIG. 8, a vapor generator 602 is arranged out of a chamber 503, and a chamber 503 is a sealed type same as the apparatus shown in FIG. 5. In addition, a substrate cassette 801 is used instead of a substrate supporting part 601 which supports a substrate 501. In the apparatus shown in FIG. 8, a plurality of substrates 501 are simultaneously cooled. The number of substrates 501 which are simultaneously cooled are same as the number of cool liquid discharging parts 602 which are arranged. Constitutions other than the above-mentioned constitutions are same as the apparatus shown in FIG. 5. In addition, a substrate cassette 801 has a mechanism such as a mesh type bottom or a punched hole from which a solvent drops so that a substrate can be fixed and a drying solvent can flow down to a lower part of a chamber 503.

In an apparatus shown in FIG. 8, since a vapor generator 802 is arranged out of a chamber 503, supplying of a drying solvent (a vapor) 409 can be stopped when drying is finished. After drying finished, there is not a vapor for heating the substrate. Thereby, nothing heats the substrate. Further applying a cooling liquid to the substrate can allow the substrate to be quickly cooled. Thereby, reduction of takt time is possible. In addition, a plurality of substrates 501 is arranged at the same time, many substrates 501 can be processed at one time. In this point, reduction of takt time can be also possible. Further, since chamber 503 is a sealing type, if drying is performed in an inactive gas atmosphere, degradation of an organic functional layer can be perfectly avoided, in which the degradation occurs by an organic functional layer's absorbing of oxygen or water included in an atmospheric air or an organic functional layer's reaction with oxygen or water included in an atmospheric air. Further, since a back surface of a substrate 501 with an organic functional coated film or a substrate installing part 601 on the back surface is cooled by a drying solvent (a cool liquid) 603, an organic functional layer is not degraded, and a remaining solvent is efficiently and surely removed.

A manufacturing apparatus of the present invention can be easily applied to a large-sized substrate. That is, in the case where only an end surface of a substrate is fixed while a back surface of a substrate with an organic functional coated film is directly discharged by a drying solvent (a cool liquid), a drying solvent (a cool liquid) is naturally attached to the back surface. Thereby, in the case of a large-sized substrate, if a cool liquid discharging part (for example, a nozzle head) is exchanged or the number of the cool liquid discharging parts is increased, an manufacturing apparatus of the present invention can be applied to a large-sized substrate.

In addition, in a method for manufacturing an organic functional layer of one embodiment of the present invention and in an apparatus for manufacturing an organic functional device using the method, a highly flexible substrate can be preferably used.

In a method of the present invention, many substrates can be easily processed at the same time by arranging a cool liquid discharging part as shown in FIG. 8. Many substrates can be processed at the same time, thereby a manufacturing efficiency can be improved according to a method for manufacturing an organic functional layer and an organic functional device manufacturing apparatus of one embodiment of the present invention.

Figure 9:
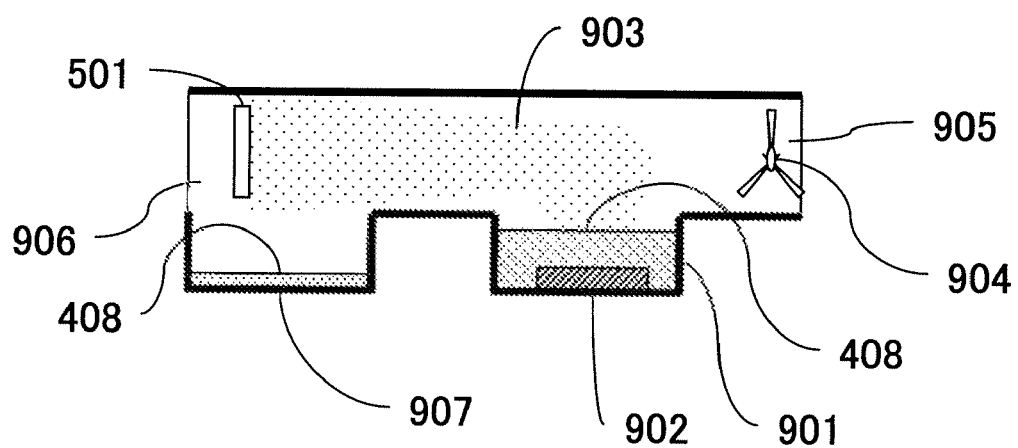
FIG. 9 is a schematic diagram of a drying equipment in an organic functional device manufacturing apparatus of one embodiment of the present invention.
Figure 10:
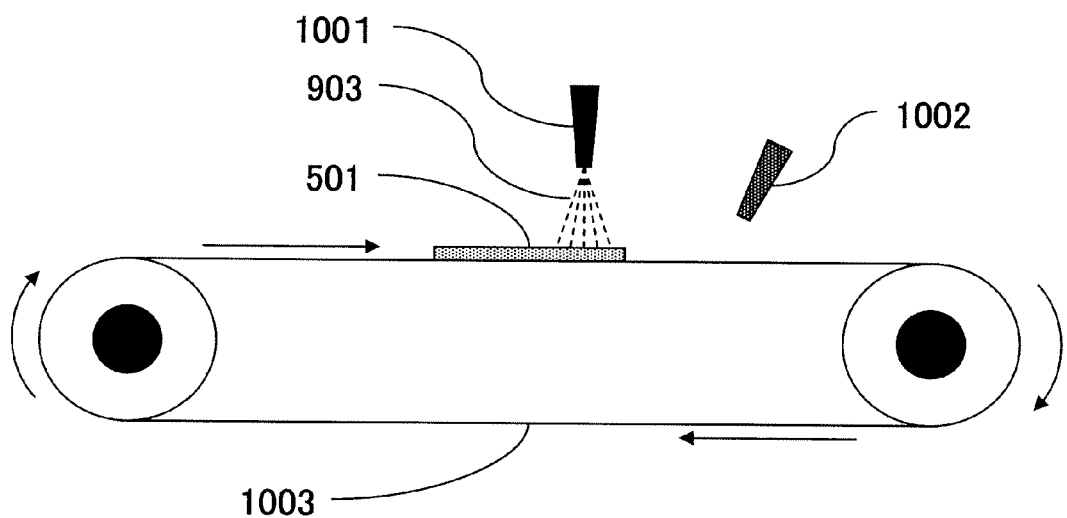
FIG. 10 is a schematic diagram of a drying equipment in an organic functional device manufacturing apparatus of one embodiment of the present invention.
Figure 11:
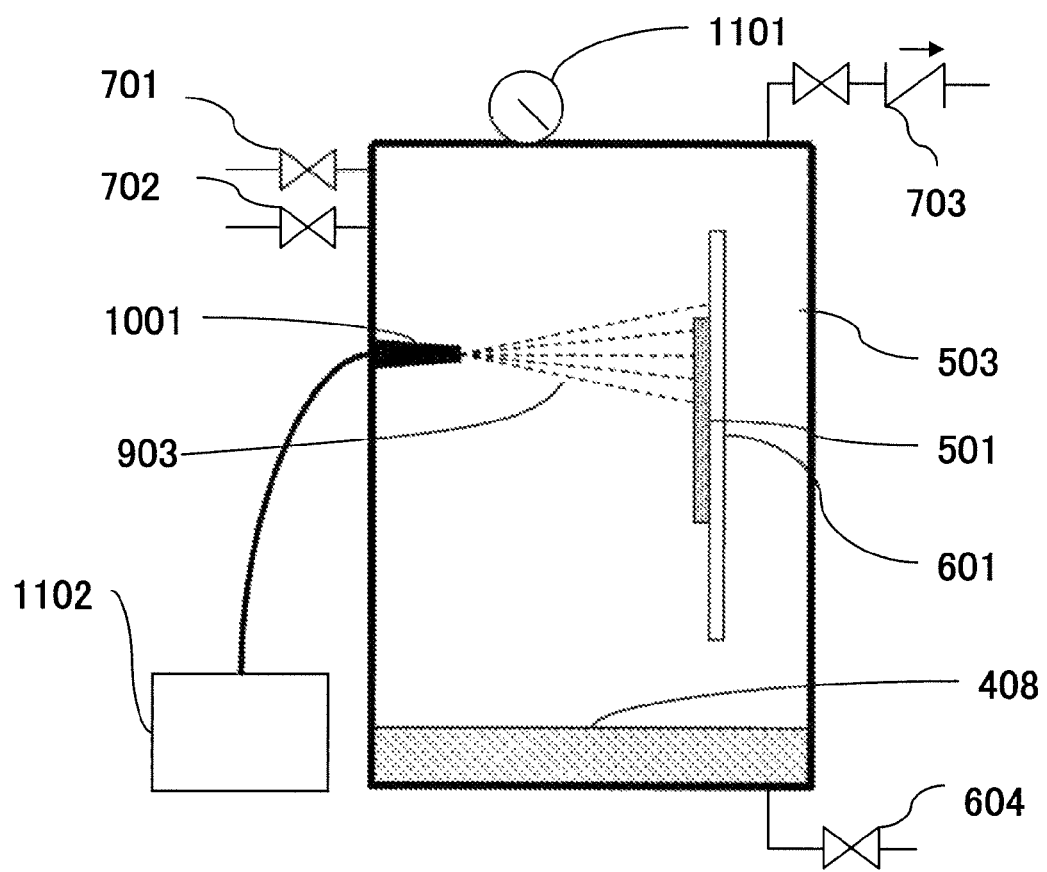
FIG. 11 is a schematic diagram of a drying equipment in an organic functional device manufacturing apparatus of one embodiment of the present invention.

In a method of the present invention, as shown in FIGS. 9-11, it is possible that a mist type drying solvent generated by spraying means is in contact with a substrate. According to this method, it is not necessary that a substrate is moved or dipped in a solution, and it is not necessary that a vapor of a drying solvent is again changed to a liquid by cooling etc. Processing at a room temperature is possible.

In an apparatus shown in FIG. 9, a mist type drying solvent 903 which is made by an ultrasonic atomizer 902 in a mist generating bath 901 is sprayed on a substrate 501 with an organic functional layer. When the liquid drop drops down, a remaining solvent is removed. A blower 904 can be used so that a mist type drying solvent is efficiently in contact with a surface of a substrate. In addition, a suction port 905 and an exhaust port 906 can be provided to the apparatus. In addition, a drying solvent 408 which drops from a substrate can be recovered in a recovery tank 907. In the case where washing by a mist is performed, it is not necessary that a drying solvent is heated and that an apparatus is covered by a heat insulating material. In addition, since a substrate is not heated, degradation due to heating does not occur.

In an apparatus shown in FIG. 10, substrate 501 with an organic functional layer is placed on a moving base 1003. A mist type drying solvent 903 is sprayed on a substrate 501 by a drying solvent spraying device 1001 which is arranged at a part above the moving base. Thereby, exchanging of a solvent is performed. In the case where an apparatus shown in FIG. 10 is used, drying of a substrate is not dried in a batch process. That is, for example, substrate 501 is placed on an endless belt type moving base 1003, and substrate 501 is moved, thereby a drying processing can be continuously performed. In FIG. 10, a substrate is placed horizontally. However, a substrate can be tilted or placed vertically so that a drying solvent rapidly flows down. A drying solvent which drops from a substrate can be appropriately recovered and reused by a non-illustrated solvent reuse apparatus.

For example, a two-fluid type nozzle can be used for a spray 1001 which sprays a drying solvent. However, any sprays can be used if a drying solvent can penetrate a coated film and a remaining solvent can be exchanged in the case where a proper amount of a drying solvent of a proper pressure is applied to a substrate 501 with an organic functional layer. Therefore, a kind of a spray or a discharging condition is appropriately selected according to a kind of an organic functional layer, adhesiveness between an organic functional layer and an underlaying material and a property of a drying solvent.

Further, in the case where an air blower 1002 is equipped with the apparatus, after a drying solvent is sprayed, a gas discharged from the air blower can remove a remaining solvent with a drying solvent 609. In addition, in the case where a drying solvent is discharged from a nozzle of a spray device, a drying solvent can be provided with an ultrasonic wave. In the case where a drying solvent is provided with an ultrasonic wave, washing and drying can be more effectively performed.

In an apparatus shown in FIG. 11, washing and drying of a substrate 501 with an organic functional layer can be performed in an atmosphere where a gas is exchanged for an inactive gas such as nitrogen. If washing and drying are performed in an inactive gas atmosphere, degradation can be avoided, in which the degradation occurs by oxygen or water included in an atmospheric air absorbed by or reacted with an organic functional layer. In addition, in the case where a heating device such as a hot plate are placed at a substrate installing part 601, after removing of a remaining solvent by a drying solvent, a heating processing can be peformed.

As described below, in a manufacturing process of an organic functional layer of an organic EL device, an organic solar cell and the like, it is often that an organic functional layer is formed on another layer in order to form a multi-layer structure device. At this case, in a process for forming an organic functional layer on another layer, there is a problem in which a mixture at an interface between both layers occurs. Even if an existing layer is perfectly dried, in the case where the existing layer has solubility because of a relation between respective layer materials, only a usual drying is insufficient. Therefore, a mixture at interface between layers is avoided by preventing the existing layer from being dissolved by an ink for a next new layer. This is achieved by the following cases: a cross-linking reaction of a most outer layer (the existing layer) material makes the existing layer incapable of being dissolved; and a chemical reaction occurs at an interface between a most outer layer and a lower layer next to the most outer layer, thereby adhesiveness is improved. In these cases, a heat processing of an organic functional layer is generally performed.

However, as mentioned above, an organic functional material easily reacts with oxygen etc. Especially, in the case where heating is performed, the reactivity is increased. Therefore, it is preferable that heating of an organic functional layer be performed under vacuum or in an inactive gas atmosphere such as nitrogen. This problem is solved by the following method: an apparatus which is shown in FIG. 11 or FIG. 12 described below is a sealed space; further, processes from removing of a solvent to heating are continuously performed in an identical space under vacuum or in an inactive atmosphere.

In addition, a device which cools a substrate after heating can be equipped with the apparatus. In this case, a device as a substrate cooling apparatus described in the explanation of the apparatus of FIG. 5 can be used. In this case, infrared ray is used for a heating apparatus so that a heating apparatus does not lie in the way. In addition, the heating apparatus can be equipped at a front side of a substrate, and heating can be performed.

Figure 12:
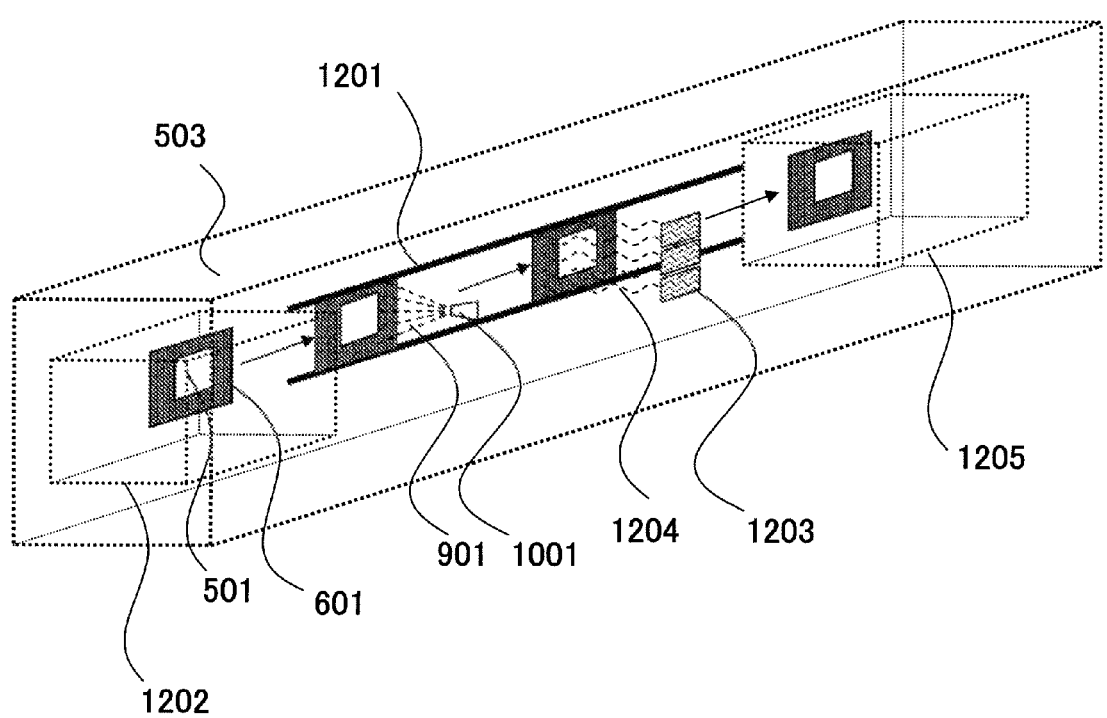
FIG. 12 is a schematic diagram of a drying equipment in an organic functional device manufacturing apparatus of one embodiment of the present invention.

In an apparatus shown in FIG. 12, a substrate is placed on the apparatus, and respective apparatuses are arranged in a processing order so that processes of a substrate are continuously performed. A substrate 501 with an organic functional layer is placed at a substrate installing part 601 by a substrate box before processing 1202. Thereafter, a substrate 501 is moved along a substrate carrying rail 1201. At first, a remaining solvent is exchanged by a mist type drying solvent discharged by a spray apparatus 701. Thereby, washing and drying are performed. Next, heating is performed by a heating apparatus 1203. In addition, means for exchanging a solvent other than a spray apparatus can be used. For example, as shown in FIGS. 5-8, contact with a heated solvent vapor and means for cooling a substrate can be also adopted.

A publicly known apparatus can be used for a heating apparatus 1203. However, it is preferable that an infrared ray apparatus which can heat a substrate from a remote place be used for heating. Since an infrared apparatus can be placed at a remote place from a carrying rail, a simple structure apparatus which can perform processing of a substrate can be used. Both near-infrared ray and far-infrared ray can be used for infrared ray. However, it is preferable that a front side of a substrate 501 be irradiated with far-infrared ray so that a substrate with a thin organic functional layer is efficiently heated. In addition, in the case where a material such as aluminum which easily reflects far-infrared ray is used for a material of a substrate holder surface, a back side of a substrate is also irradiated with infrared ray which passes through a substrate and is reflected. Therefore, heating of a substrate can be efficiently performed.

(A Manufacturing Method and a Device Constitution of an Organic EL Device and an Organic Solar Cell)

Next, an organic EL device and an organic solar cell are explained referring to FIG. 1, in which these devices are manufactured by a method for manufacturing an organic functional layer of one embodiment of the present invention and by an organic functional device manufacturing apparatus using this method.

A substrate 101 used in the invention is not particularly limited as long as it is a substrate having translucency and a certain level of strength, and specifically, a glass substrate, or a plastic film or sheet can be used. When a thin glass substrate having a thickness of 0.2 to 1 mm is used, a thin organic EL element or an organic solar cell having extremely high barrier properties can be produced.

A transparent conductive layer 102 is not particularly limited as long as it is formed with an electrically conductive material enabling formation of a transparent or translucent electrode. For example, as oxide, complex oxide of indium and tin (ITO), complex oxide of indium and zinc (IZO), tin oxide, zinc oxide, indium oxide and zinc aluminium complex oxide can be used.

Above all, ITO has the following characteristics: Therefore, it is preferable.
1. low electrical resistance
2. solvent resistance
3. transparence The film can be formed on the transparent substrate 101 with a vapor deposition or sputtering method. Also, it can be formed by coating a precursor such as indium octylate or acetone indium on the substrate, followed by an application thermal decomposition method in which oxide is formed by thermal decomposition. Alternatively, a metal such as aluminum, gold or silver may be used after vacuum evaporation to give a translucent state. Alternatively, an organic semiconductor such as polyaniline can be also used.

Patterning of the transparent conductive layer 102 is performed by etching if necessary. In addition, activation of the surface can be performed by a UV processing, a plasma processing and the like.

An organic functional layer 103 in one embodiment of the present invention can be comprised of a single layer or a plurality of functional layers. In the case of an organic EL device, it is necessary for at least an organic light emitting layer to be provided between an anode and a cathode. However, besides, as a functional layer, a charge transport layer such as a hole injection layer, a hole transport layer, an electron transport layer and an electron injection layer can be provided. Arbitrary constitutions can be adopted.

In addition, in the case of an organic solar cell, it is necessary that an active layer is provided between an anode and a cathode. In an active layer, there are a plurality of materials in a state of multi-hetero-junction in which interfaces complexly intertangle. In addition to this, a charge transfer layer can be provided as an organic functional layer in order to take out of charges which are generated there. An organic functional layer can have an arbitrary thickness. However, if the layer is too thin, short-circuit easily occurs. If the layer is too thick, resistance of a whole device becomes too high. Therefore, it is preferable that a total film thickness be 50-1000 nm.

Materials generally used for a hole transport material can be used for a material of a charge transport layer 103a which is mainly provided in a position next to a transparent conductive layer 102. Copper phthalocyanine and the derivative, and Low molecular weight material such as the following aromatic amine system can be used: 1,1-bis((4-di-p-tolylamino phenyl)Cyclohexane) cyclohexane; and N,N'-diphenyl-N,N'-bis((3-methylphenyl))-1,1'-biphenyl-4,4'-diamine; and N,N'-di(one-naphthyl)-N,N'-diphenyl-1,1'-biphenyl-4,4'-diamine. However, in view of film formation, the following high molecular weight materials are preferable: a polyaniline derivative; a polythiophene derivative; a polyvinylcarbazole (PVK) derivative; and a mixture (PEDOT/PSS) of poly (3,4-ethylenedioxythiophene) (PEDOT) and polystyrene sulfonic acid (PSS). In addition, the following materials can be used: a low-molecular material showing charge transport property such as aryl amines, carbazoles, aryl sulfide, thiophenes or phthalocyanines is mixed with an electroconductive polymer such as poly arylene system such as polyparaphenylene (PPP) or PAV [polyarylenevinylene] system such as polyphenylene vinylene (PPV) or polymers such as polystyrene (PS).

The following materials can be used for a light emitting body which is used for an organic light emitting layer 103b of an organic EL device: a low molecular light emitting coloring matter such as coumarin system, perylene system, pyran system, anthrone system, porphyrin system, quinacridon system, N,N'-dialkyl permutation quinacridon system, naphthalimido system, N,N'-diaryl permutation pyrrolo pyrrole series, iridium complex system, platinum complex system or europium complex system is dissolved in or copolymerized with polymers such as PS, polymethyl methacrylate or polyvinyl carbazole. In addition, polymer light emitting bodies such as poly arylene system, PAV [polyarylenevinylene] system or poly fluorene system can be used.

In addition, an interlayer can be provided between an organic light emitting layer 103b and a charge transport layer 103a in an organic EL device. The interlayer is a material which improves adhesiveness with a charge transport layer 103 by heating. It is known that this interlayer makes a light emitting efficiency of an organic light emitting layer 103b increased and makes a driving-life time long. Example of such a material is poly(2,7-(9,9-di-n-octylfluorene)-alt-(1,4-phenylene-((4-sec-butylphenyl)amino)-1,4-phenylene)) (TFB).

P type/N type semiconductor materials in which charge separation occurs by irradiation of light can be used for a material used for an active layer 103b in an organic solar cell. In particular, a polythiophene derivative and a polyphenylene vinylene derivative are P type semiconductors, and a fullerene derivative is a N type semiconductor.

If these materials are low molecular types, a film can be formed by an evaporation method. However, a coating liquid is made by dissolving or dispersing these materials in the following solvent, and a film can be formed by printing methods such as a spin coat method, a curtain coat method, a bar coat method, a wire coat method, a slit coat method or printing methods such as a relief printing method (a flexo printing method), an intaglio offset printing method, a relief reverse offset printing method, an inkjet printing method, an intaglio printing method: a solvent or a mixed solvent of toluene, xylene, acetone, anisole, methyl anisole, dimethylanisole, benzoic ether, methyl benzoate, mesitylene, tetralin, amyl benzene, methyl ethyl ketone, methyl isobutyl ketone, cyclohexanone, methanol, ethanol, isopropanol, ethyl acetate, butyl acetate and water.

However, it is necessary for an organic EL device capable of displaying full colors to have organic light emitting layers of patterns of R, G and B. In the case where patterning of an organic light emitting layer is performed, a printing method such as a relief printing method (a flexo printing method), an intaglio offset printing method, a relief printing type reverse offset printing method, an ink jet printing method and an intaglio printing method is preferably used. Patterns of organic light emitting layers of different light emitting colors can be formed for every pixel. In addition, in an organic EL device, as for a charge transport layer such as a hole transport layer and an electron transport layer, patterning is preferably performed for every pixel in order to prevent current from leaking to an adjacent pixel. In this case, a printing method such as a relief printing method (a flexo printing method), an intaglio offset printing method, a relief printing type reverse offset printing method, an ink jet printing method and an intaglio printing method is also preferably used.

In an organic solar cell, patterning of an active layer and a charge transfer layer is necessary in order to obtain a high efficiency and a high electromotive force. A printing method such as a relief printing method (a flexo printing method), an intaglio offset printing method, a relief printing type reverse offset printing method, an ink jet printing method and an intaglio printing method is preferably used. Therefore, a manufacturing method of the present invention is effective.

An organic functional layer is formed by a method for manufacturing an organic functional layer of one embodiment of the present invention and by an organic functional device manufacturing apparatus of one embodiment of the present invention. All of an organic functional layer can be formed by the above method. Besides, respective layers can be formed by a combined method including other wet process and dry process Next, an electrode layer 105 of a cathode is formed over an organic functional layer 103. The following materials can be used for an electrode layer: Metal simple substance such as Mg, Al, Yb, Ba and Ca can be used; Li and chemical compound such as LiF of around 1 nm thickness are placed in a surface boundary of a luminescent medium material, and Al and the Cu of which stability/conductivity is high can be laminated; and alloy system of the low work function metal and the stable metal of which both electron injection efficiency and stability are high can be used. (alloys such as MgAg, AlLi or CuLi.)

As for the formation method of a cathode, depending on the material, a resistance heating vapor deposition method, an eletron beam method and a sputtering method can be used.

As for the thickness of an electrode layer, about 10 nm-1,000 nm are desirable.

Heating of a substrate can be performed before, after or both before and after, an electrode layer 105 is formed in order to improve adhesiveness between respective layers.

A glass cap and an adhesive are used, and these functional laminated body is sealed last to protect it from external oxygen and moisture. In this way, the organic EL device is obtained. In addition, in the case where a transparent substrate is flexible, sealing is performed by using a sealing agent and a flexible film.

As for an organic EL device and an organic solar cell, an organic functional is not degraded and a remaining solvent is surely removed. Therefore, an organic EL device and an organic solar cell of a high quality can be obtained, in which luminance and light emitting life are not reduced.

<A Method for Manufacturing a Thin Film Transistor and a Device Constitution>

A thin film transistor (an organic functional device) is described below referring to FIG. 2, in which the thin film transistor is manufactured by a method for manufacturing an organic functional layer of one embodiment of the present invention, and by an apparatus for manufacturing an organic functional device of one embodiment of the present invention.

Figure 2:
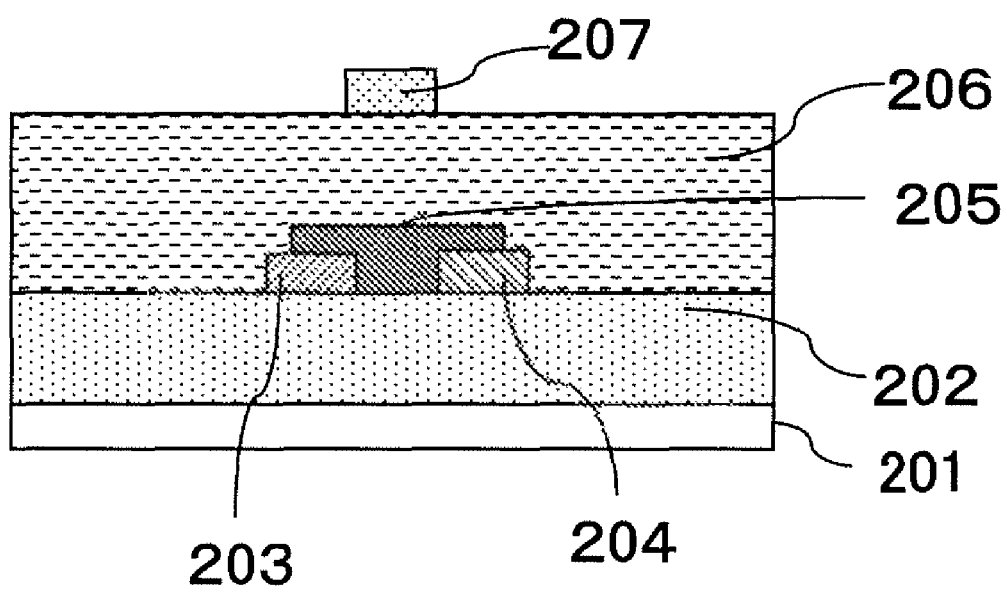
FIG. 2 is a cross-sectional view of one example of an organic thin film transistor of one embodiment of the present invention.

In a top gate type thin film transistor of FIG. 2, an inorganic insulating layer 202 is formed on a substrate 201. Further, a source electrode 203 and a drain electrode 204 are formed on an inorganic insulating layer 202. Further, an organic semiconductor layer 205 is formed, and a gate insulating layer 206 is formed on an inorganic semiconductor layer 205. A gate electrode 207 is formed on a gate insulating layer 206.

In a top gate type thin film transistor, known materials such as glass, metal and plastic can be used for a substrate 201. Especially, plastic materials can be preferably used. Examples of plastic materials include a film or a sheet of polyethylene terephthalate, polyethylenenaphthalate, polyether sulfone, cyclo-olefin polymers, polyimide, nylon, aramid, polycarbonate, polymethyl methacrylate, polyvinyl chloride and triacetylcellulose. Among them, polyethylenenaphthalate, polyether sulfone, cyclo-olefin polymer and polyimide resistant to heat are preferably used.

An inorganic insulating layer 202 is formed on a substrate 201 if necessary. Examples of an inorganic insulating layer 202 include various oxides and oxynitrides such as $SiO_2$, $Al_2O_3$, SiON and $Ta_2O_5$. A vacuum vapor deposition method, a sputtering method and a CVD method can be used for a layer formation method.

Next, a source electrode 203 and a drain electrode 204 are formed on an inorganic insulating layer 202. Examples of a source electrode material and a drain electrode material include gold, silver, copper, nickel, platinum, palladium and rhodium. A film of these materials can be formed by a resistive heating vapor deposition, an electron beam process, or a sputtering. However, a film can be formed by a printing method, in which metal nanosized particles of them are dissolved or dispersed in a solvent of water or alcohol. Here, a metal nanosized particle mean a metal particle having an average particle diameter less than 1 μm.

Next, an organic semiconductor layer 205 is formed on an inorganic insulating layer 202, a source electrode 203 and a drain electrode 204. Examples of an organic semiconductor layer forming material include poly thiophenes, a polyphenylene vinylene derivative, a polythienylen vinylene derivative, poly allylamines, poly acetylenes, an acene derivative, an oligothiophene derivative. A film can be formed by coating methods such as a spin coat method, a curtain coat method, a bar coat method, a wire coat method and a slit coat method, and printing methods such as a relief printing method (a flexo printing method), an intaglio offset printing method, a relief reverse type offset printing method, an ink-jet method and a intaglio printing method, in which an ink (a coating liquid) with the above materials dissolved or dispersed in a solvent is used.

In an organic transistor, at least one layer of a source electrode, a drain electrode, a gate electrode and an organic semiconductor layer is preferably formed by printing methods such as a relief printing method (a flexo printing method), an intaglio offset printing method, a relief reverse type offset printing method, an ink-jet method and a intaglio printing method. However, it is not necessary that all constituent elements are formed by printing methods.

These source electrode, drain electrode, gate electrode and organic semiconductor layer are formed by an above-mentioned method for forming an organic functional layer of one embodiment of the present invention in which an organic functional device manufacturing apparatus of one embodiment of the present invention is used. All organic functional layers may be formed by the above method. Besides, respective layers may be formed other combination methods including a wet process and a dry process.

Next, a gate insulating layer 206 is formed on an organic semiconductor layer 205. An organic insulating film which can be easily formed can be preferably used for a gate insulating layer 206. For example, polyvinyl phenol can be used. In the case of polyvinyl phenol, for example, a gate insulating layer is formed on an organic semiconductor layer by a spin coat method using a coating liquid in which polyvinyl phenol is dissolved in isopropyl alcohol.

Next, a gate electrode 207 is formed on a gate insulating layer 206. A gate electrode 207 can be formed by printing methods such as a relief printing method, an intaglio printing method, a screen printing method, a gravure printing method, a flexo printing method and an offset printing method. Further, a vapor deposition method using a mask can be used. In the case where a gate electrode is formed by a printing method, an ink including a conductive material such as gold, silver, copper, nickel, platinum, palladium and rhodium can be used. In addition, in the case where a gate electrode 207 is formed by a vacuum vapor deposition, Al, gold, platinum, palladium and rhodium can be used.

In the present invention, even if an organic functional layer is formed by a printing method, degradation of characteristics of an organic functional device due to removal of a solvent does not occur. In addition, a method and an apparatus, in which a high performance organic functional device can be manufactured, are provided. In addition, in the present invention, an organic functional device manufactured by the manufacturing method is provided. In addition, a method for manufacturing an organic EL device, an organic solar cell and an organic thin film transistor, in which the manufacturing method is used, is provided.

In more particular, according to a method for manufacturing an organic functional device of the present invention, a remaining solvent included in an organic functional layer of which pattern is formed by a printing method is exchanged for a drying solvent. Thereby, drying is possible without degradation of an organic functional layer due to heating etc. In addition, in the case where a fluorine system solvent, especially a fluorine system solvent comprised of a molecule having 5 or more fluorine atoms, is used, wettability is good, thereby drying is possible without degradation of an organic functional material. Especially, in the case of a drying solvent having a surface tension of 25 mN/m or less, penetration of a drying solvent to an organic functional layer is improved, thereby a high drying performance can be achieved. Therefore, a remaining solvent can be easily removed in which an organic functional layer is not damaged. Further, in the case where a drying solvent which satisfies a condition in Claim 10 is used, manufacturing is possible in which influence on an organic functional layer is more reduced. In addition, as a result, a high quality organic functional device can be manufactured by using a manufacturing apparatus of the present invention and by the above-mentioned method.

In addition, a back surface of a substrate with a coated film or a substrate installing part on the back surface is in contact with a liquid drying solvent. The temperature of the liquid drying solvent is higher than a dew point of an atmosphere in which a substrate is placed, and is lower than a boiling point of a drying solvent. In this process, a substrate is cooled. An atmosphere of the drying solvent gasified by heating is in contact with a coated film on the substrate. Thereby, dew of a drying solvent is formed on a substrate. So, a drying solvent can penetrate to an organic functional layer. A remaining solvent is exchanged for a drying solvent. Thereby, a remaining solvent can be efficiently removed. In addition, the above manufacturing method can be realized by using an organic functional device manufacturing apparatus of an embodiment of the present invention.

In addition, after removal of a remaining solvent by a drying solvent, especially in the case where a substrate is heated, if heating is performed in a sealed space filled with an inactive gas atmosphere, damage of an organic functional layer by oxygen etc. can be avoided. This invention is especially effective in the case where a plurality of organic functional layers are formed.

In addition, in the case where an organic functional device is manufactured by a method for manufacturing an organic functional layer of the present invention, a high quality organic functional device can be manufactured, in which a damage by a drying process or a reduction of luminance or light emitting life due to a remaining solvent is reduced In addition, a manufacturing method of the present invention becomes possible because it has vapor generating means for generating a vapor of a drying solvent, and means for cooling a substrate by discharging a fluid including a drying solvent to a back surface of a substrate with a coated film or a substrate installing part in which a drying solvent is in contact with the back surface or the substrate. Further, since a substrate is not dipped in a drying solvent for cooling, an impurity is not attached to a substrate.

EXAMPLES

Hereinafter, the followings are concretely described referring to Examples: a method for manufacturing an organic functional layer and an organic functional device of one embodiment of the present invention; and an organic functional device manufacturing apparatus of one embodiment of the present invention.

However, the present invention is not limited to these.

<Examples of an Organic EL Device>

Examples of an organic EL device are described below.

The organic EL device was manufactured by a method for manufacturing an organic functional layer and an organic functional device of one embodiment of the present invention, and by an apparatus for manufacturing an organic functional device A glass substrate of 500 mm square with ITO was prepared. ITO of a predetermined pattern was formed by etching of ITO. Next, a pattern of a following coating liquid for an electron transport layer was applied to the etched transparent conductive layer (the substrate with ITO) by a relief printing method: a mixed product of poly(3,4-ethylenedioxythiophene) and polystyrenesulfonic acid was dispersed in water. This substrate was dried at 200 degrees Celsius for 3 minutes in air. The film thickness after drying was 50 nm.

In addition, a pattern of a following coating liquid for a light emitting layer was applied to the substrate by a relief printing method: poly(2-(2-ethyl hexyloxy methoxy)-5-methoxy-1,4-Phenylenevinylene) (glass transition temperature: 196 degrees Celsius) (a macromolecular luminous body of PAV [polyarylenevinylene] system) was dissolved in a mixed solvent of 50% toluene and 50% para diethylbenzene (a first organic solvent).

Further, drying processes described in Example 1 and Comparative Example 1 were performed for a substrate with an organic functional layer. Thereafter, lithium and aluminum were respectively deposited to 0.5 nm and 200 nm thicknesses by a vacuum vapor deposition, thereby an organic EL device was obtained. Hereinafter, drying processes and manufacturing results in Examples and Comparative Examples are mainly described.

Example 1

In a drying process, a substrate with an organic functional layer was arranged on a substrate holder. An organic EL device was manufactured by using an apparatus shown in FIG. 4. Ethyl nona fluorobutyl ether (a second organic solvent) was used for a drying solvent. Ultrasonic treatments of three kinds of frequencies (26 kHz, 45 kHz, 100 kHz) were performed for 5 min. using a drying solvent of 25 degrees Celsius. Dipping in a drying solvent of 15 degrees Celsius in a rinse tank was performed for 10 min. Exposing to a vapor in a vapor bath was performed for 3 min. Further, the process of the rinse tank and the vapor bath was repeated 3 times.

In the case where a voltage of 8 V was applied to the obtained organic EL device, light of 100 cd/m$^2$ was emitted as a pattern. In addition, in the case where an initial luminance was 100 cd/m$^2$, half life of luminance at a constant current driving was 3000 hours.

After a substrate with an organic functional layer was manufactured and dried by the same way, concentrations of respective solvents in an organic functional layer were measured by GC-MS in order to measure concentrations of respective solvents in a dried organic functional device. The results were as follows: all of concentrations of toluene, para diethylbenzene and ethyl nona fluorobutyl ether were less than 0.1 ppm (less than a detection limit). Hereinafter, all of concentrations of remaining solvents in respective Examples and Comparative Examples were measured by a GC-MS method.

Comparative Example 1

Poly(2-(2-ethyl hexyloxy methoxy)-5-methoxy-1,4-Phenylenevinylene) was applied to a substrate. Thereafter, the substrate was dried in a reduced pressure oven of 30 Pa and 130 degrees Celsius for 3 hours while an apparatus shown in FIG. 4 was not used. That is, an organic EL device was manufactured by the same way as Example 1 except for the above-mentioned process.

In the case where a voltage of 10 V was applied to the obtained organic EL device, light of 100 cd/m$^2$ was emitted as a pattern. In addition, in the case where an initial luminance was 100 cd/m$^2$, half life of luminance at a constant current driving was 1500 hours. In addition, concentration of toluene in the dried organic functional layer was less than 0.1 ppm (less than a detection limit). However, concentration of para diethylbenzene was 20 ppm.

Example 2

An organic EL device was manufactured by the same process as Example 1 except for the following processes: trideca fluoro hexyl methylic ether (a second organic solvent) was used as a drying solvent; ultrasonic treatment was not performed; and, dipping in a rinse tank of 15 degrees Celsius was performed for 10 min. and dry washing by a vapor in a vapor bath was performed for 3 min. (the dipping and the washing were repeated 4 times.)

In the case where a voltage of 8 V was applied to the obtained organic EL device, light of 100 cd/m$^2$ was emitted as a pattern. In addition, in the case where an initial luminance was 100 cd/m$^2$, half life of luminance at a constant current driving was 3000 hours. In the case where concentrations of respective solvents in the dried organic functional layer were measured, all of concentrations of toluene, para diethylbenzene and trideca fluoro hexyl methylic ether were less than 0.1 ppm (less than a detection limit).

Example 3

An organic El device was manufactured through a drying process using an apparatus shown in FIG. 5 for drying an organic functional layer. A substrate cooler in this example was a box made of SUS316 in which a cooling water of 20 degrees Celsius circulated wherein a substrate was attached to the substrate cooler by a plate spring. Methyl nona fluorobutyl ether was used for a drying solvent. The substrate was exposed to a vapor in a vapor bath for 30 min., thereby the substrate was dried. Thereafter, the substrate was taken out of the box, and the substrate was heated for 30 min. on a hot plate of 150 degrees Celsius under a nitrogen atmosphere.

In the case where a voltage of 8 V was applied to the obtained organic EL device, light of 100 cd/m$^2$ was emitted as a pattern. In addition, in the case where an initial luminance was 100 cd/m$^2$, half life of luminance at a constant current driving was 6000 hours. In the state before heating under a nitrogen atmosphere was performed, concentrations of respective solvents in the dried organic functional layer were as follows: toluene, para diethylbenzene and methyl nona fluorobutyl ether were less than 0.1 ppm (less than a detection limit).

Example 4

An organic EL device was manufactured by the same process as Example 3 except that hepta fluoro propyl methylic ether was used for a drying solvent in a drying process.

In the case where a voltage of 8 V was applied to the obtained organic EL device, light of 100 cd/m² was emitted as a pattern. In addition, in the case where an initial luminance was 100 cd/m², half life of luminance at a constant current driving was 6000 hours. Concentrations of toluene, para diethylbenzene and hepta fluoro propyl methylic ether in the dried organic functional layer were less than 0.1 ppm (less than a detection limit).

Example 5

An organic EL device was manufactured through a drying process using a drying apparatus shown in FIG. 8 for drying an organic functional layer. A substrate cassette 801 was constituted by a flame, in which a drying solvent could be easily dropped to lower part. In addition, 20 sheets of substrates 501 could be arranged in the cassette 801. Respective substrates were fixed while respective end faces thereof were supported. A slit type 2 fluid nozzle (a product of SPRAYING SYSTEMS CO., JAPAN) was used for a cold liquid discharging part. A back surface of substrate 501 in the cassette 801 was arranged so as to be selectively discharged by a drying solvent (a cool liquid), wherein the back surface was an opposite surface of an organic functional coating liquid film side. Nona fluorobutyl methyl ether was used for a drying solvent. Further, after the drying solvent was heated to 70 degrees Celsius in a vapor generator 802, the drying solvent was introduced to a chamber 503. Chamber 503 was beforehand filled with nitrogen, and the oxygen concentration was 10 ppm and the dew point was −60 degrees Celsius. Substrate 501 was continuously soused by a drying solvent (a cool liquid) 603 of 23 degrees Celsius for 30 min. while substrate 501 was exposed to a drying solvent (a vapor) 603 in this chamber 503. Thereafter, supplying of a drying solvent (a vapor) and discharging of a drying solvent (a cool liquid) were stopped. Substrate 501 was taken out of chamber 503. Anneal processing was performed for 30 min. by putting the substrate on a hot plate of 150 degrees Celsius under a nitrogen atmosphere. In addition, a takt time of a drying process was 1 sheet/about 2 min.

In the case where a voltage of 8 V was applied to the obtained organic EL device, light of 100 cd/m² was emitted as a pattern. In addition, in the case where an initial luminance was 100 cd/m², half life of luminance at a constant current driving was 6000 hours. In the state before heating under a nitrogen atmosphere was performed, concentrations of respective solvents in the dried organic functional layer were as follows: toluene, para diethylbenzene and nona fluorobutyl methyl ether were less than 0.1 ppm (less than a detection limit).

Reference Example 1

An organic EL device was manufactured by the same process as Example 5 except for the following processes: an apparatus shown in FIG. 5 was used for a drying apparatus; a substrate installing part was a substrate cooler 502 having a box made of SUS316 in which a cooling water of 23 degrees Celsius circulated.

The obtained organic EL device showed device characteristics similar to those of Example 1. However, only one sheet of a substrate was arranged in a drying machine per one time. Therefore, the takt time was about 40 min./one sheet. Thereby, it was understood that an organic functional device manufacturing apparatus shown in FIG. 8 could reduce a takt time.

Example 6

A solvent of a coating liquid for a light emitting layer was changed from a mixed solvent including 50% of toluene and 50% of para diethylbenzene to 100% of dichlorobenzene. An organic EL device was manufactured by using an apparatus similar to that of Example 5.

An organic EL device was manufactured by changing time for exposing to a vapor and sousing a cooling liquid to the followings (A)-(D): (all processes except for this process (exposing and sousing) were same as Example 5.)

(A) time for exposing to a vapor and sousing a cooling liquid: 30 min.

(B) time for exposing to a vapor and sousing a cooling liquid: 20 min.

(C) time for exposing to a vapor and sousing a cooling liquid: 10 min.

(D) time for exposing to a vapor and sousing a cooling liquid: 0 min. (natural drying was performed without drying by nona fluorobutyl methyl ether.)

Table 1 shows characteristics of these devices as well as concentrations of dichlorobenzene in organic functional layers before heating under a nitrogen atmosphere. Besides, a result of measuring concentration of dichlorobenzene in a thin film is shown, wherein the thin film was obtained by scratching an organic layer in the case where a sealing of a device was not performed after vapor deposition of a cathode. In addition, as for (D), since a drying process advanced in a annealing process after a drying process, the result is also shown.

As shown in Table 1, when the remaining dichlorobenzene becomes 1 ppm or less, characteristics become stable. Therefore, in the case where both this device constitution and a solvent are used, an acceptable amount of a remaining solvent is 1 ppm.

In addition, it was found that an amount of a remaining solvent in the case of a drying method using a second solvent is less than that in the case of a drying method by heating. Especially, a method for cooling by a cooling liquid in which exposing to a vapor is simultaneously performed is superior.

In addition, in the cases of (A)-(C), difference in an amount of a remaining solvent between before and after vapor deposition was small. However, in the case of (D), the difference was not so small. Therefore, it was found that drying occurs a little under high vacuum at vapor deposition, but that an additional drying does not occur in the case of low concentration as several ppm. In the case of (D), drying also advances in an annealing process, however drying further advances after vapor deposition. It is thought that this difference of dichlorobenzene was vaporized in a vaporizing apparatus, however it was possible that the vaporizing apparatus was polluted with the vaporized dichlorobenzene.

Characteristics of an organic EL device and an amount of a solvent remaining in an organic functional thin film

| Drying method | Characteristics of an organic EL device | | An amount of dichlorobenzene remaining in a thin film (ppm) | |
|---|---|---|---|---|
| | Luminance in the case where an applied voltage was 8 v (cd/m$^2$) | half-value period of luminance in the case where an initial luminance was 100 cd/m$^2$ | Before heating under a nitrogen atmosphere | After vapor deposition of a cathode |
| (A) processing time: 30 min. | 100 | 6000 | 0.1 | 0.1 |
| (B) processing time: 20 min. | 101 | 6000 | 1.0 | 1.0 |
| (C) processing time: 10 min. | 97 | 4000 | 4.1 | 4.0 |
| (D) processing time: 0 min. (natural dray) | 70 | 1500 | 705.3 | 18.9 |
| (D) processing time: 0 min. (annealing processing: 150 degrees Celsius) | | | (20.1) | |

Example 7

An organic EL device was manufactured through a drying process using a drying washing apparatus shown in FIG. 10 for drying an organic functional layer. Methyl nona fluorobutyl ether was used for a drying solvent. After drying by spraying a drying solvent was performed for 30 min., a substrate was taken out of the apparatus. The substrate was heated on a hot plate of 150 degrees Celsius for 30 min. under a nitrogen atmosphere.

In the case where a voltage of 8 V was applied to the obtained organic EL device, light of 100 cd/m$^2$ was emitted as a pattern. In addition, in the case where an initial luminance was 100 cd/m$^2$, half life of luminance at a constant current driving was 7000 hours. In the state before heating under a nitrogen atmosphere was performed, concentrations of respective solvents in the dried organic functional layer were as follows: toluene, para diethylbenzene and methyl nona fluorobutyl ether were less than 0.1 ppm (less than a detection limit).

Example 8

An organic EL device was manufactured by the same process as Example 7) except that hepta fluoro propyl methylic ether was used for a drying solvent and an apparatus shown in FIG. 12 was used in a drying and heating process. Same as Example 7, a spray apparatus for spraying a drying solvent was used for means for exchanging solvents. In a drying process, a drying solvent was sprayed for 15 min. wherein a pressure of the spray was 0.1 MPa, and wherein the apparatus was filled with nitrogen. Next, a substrate was heated to 180 degrees Celsius by an infrared heater equipped with the apparatus. This state was kept for 1 hour.

In the case where a voltage of 8 V was applied to the obtained organic EL device, light of 100 cd/m$^2$ was emitted as a pattern. In addition, in the case where an initial luminance was 100 cd/m$^2$, half life of luminance at a constant current driving was 6000 hours. Concentrations of toluene, para diethylbenzene and hepta fluoro propyl methylic ether in the dried organic functional layer were less than 0.1 ppm (less than a detection limit).

Example 9

An organic functional layer was formed on a transparent conductive film, wherein the organic functional layer was an electron transport layer comprised of a mixture of poly(3,4-ethylenedioxythiophene) and polystyrenesulfonic acid. Further, the organic function a layer was dried. Thereafter, a pattern of an ink was applied to a substrate by a relief printing method, in which the ink was made by dissolving TFB (an interlayer material) in a mixed solvent comprised of 50% toluene and 50% para diethylbenzene. This substrate was washed and dried by using an apparatus shown in FIG. 12, and was further heated same as Example 8. Ethyl nona fluorobutyl ether was used for a drying solvent. A surface temperature of the substrate was 180 degrees Celsius in the heating process, and the heating process at this state was for 1 hours. Thereafter, the substrate after the heating process was again soused by ethyl nona fluorobutyl ether, thereby the substrate was cooled to a room temperature.

The substrate was taken out of the apparatus. Excess TFB was washed away by xylene. Thereafter, by the same process as Example 5, a film of poly(2-(2-ethyl hexyloxy methoxy)-5-methoxy-1,4-Phenylenevinylene) which was a light emitting layer was formed and dried. A cathode was deposited, thereby a device was manufactured.

In the case where a voltage of 9 V was applied to the obtained organic EL device, light of 100 cd/m$^2$ was emitted as a pattern. In addition, in the case where an initial luminance was 100 cd/m$^2$, half life of luminance at a constant current driving was 15000 hours. Concentrations of toluene, para diethylbenzene and hepta fluoro propyl methylic ether in the dried organic functional layer were less than 0.1 ppm (less than a detection limit).

<Examples of an Organic Solar Cell>

Examples of an organic solar cell are described below. The organic solar cell was manufactured by a method for manufacturing an organic functional layer and an organic functional device and by an organic functional device manufacturing apparatus of one embodiment of the present invention.

Example 10

An organic solar cell was manufactured by the same processes as Example 1 except for the following points: a mixed material of poly(2-methoxy-5-(3,7-dimetyloctyloxy)-1,4-phenylenevinylene) (MDMO-PPV) and [6,6]-phenyl C61-methyl butyrate ester (PCBM) dissolved in para diethylbenzene (boiling point: 180-183 degrees Celsius) was used for an ink of an organic functional material (in this case, the ratio of poly(2-methoxy-5-(3,7-dimetyloctyloxy)-1,4-phenylenevinylene) (MDMO-PPV) to [6,6]-phenyl C61-methyl butyrate ester (PCBM) was 1:4. Further, in this case, poly(2-(2-ethyl hexyloxy methoxy)-5-methoxy-1,4-Phenylenevinylene) and a mixed solvent of 50% toluene and 50% para diethylbenzene were not used.); a drying solvent was changed to 1,1,2,2,3,3,4-heptafluoro cyclopentane; temperatures of an ultrasonic bath and an rinse tank were respectively 30 degrees Celsius and 25 degrees Celsius.

As for the obtained organic solar cell, efficiency was 2.0% in the case of AM1.5. In addition, concentrations of para diethylbenzene and 1,1,2,2,3,3,4-heptafluoro cyclopentane in the dried organic function layer were less than 0.1 ppm (less than a detection limit).

Comparative Example 2

An organic solar cell was manufactured by the same method as Example 10 except for the following points: a substrate applied by a mixed ink comprised of MDMO-PPV and PCBM was inserted in a reduced pressure oven of 30 Pa and 130 degrees Celsius for 3 hours, and was dried; and a washing drying apparatus shown in FIG. 4 was not used.

As for the obtained device, efficiency was 1.5% in the case of AM1.5. In addition, concentration of para diethylbenzene in the dried organic functional layer was 50 ppm.

Example 11

An organic solar cell was manufactured by the same processes as Example 5 except for the following points: a mixed material of poly(2-methoxy-5-(3,7-dimetyloctyloxy)-1,4-phenylenevinylene) (MDMO-PPV) and [6,6]-phenyl C61-methyl butyrate ester (PCBM) dissolved in para diethylbenzene (boiling point: 180-183 degrees Celsius) was used for an ink of an organic functional material (in this case, the ratio of poly(2-methoxy-5-(3,7-dimetyloctyloxy)-1,4-phenylenevinylene) (MDMO-PPV) to [6,6]-phenyl C61-methyl butyrate ester (PCBM) was 1:4. Further, in this case, poly(2-(2-ethyl hexyloxy methoxy)-5-methoxy-1,4-Phenylenevinylene) and a mixed solvent of 50% toluene and 50% para diethylbenzene were not used.); and a drying solvent was changed to 1,1,1,3,3-pentafluoro butane.

As for the obtained organic solar cell, efficiency was 2.0% in the case of AM1.5. In addition, when concentrations of respective solvents in the dried organic functional layer were measured, para diethylbenzene and 1,1,1,3,3-pentafluoro butane were less than 0.1 ppm (less than a detection limit).

<Examples of an Organic Thin Film Transistor>

Examples of an organic thin film transistor are described below, in which the organic thin film transistor was manufactured by a method for manufacturing an organic functional layer and an organic functional device, and by an organic functional device manufacturing apparatus of one embodiment of the present invention.

Example 12

A polyethylenenaphthalate (PEN) film was used for a substrate. $SiO_2$ was deposited to 30 nm thickness for an inorganic insulating layer. Further, an Ag nano ink was applied to a substrate by a relief printing method, thereby a source electrode and a drain electrode were formed. Thereafter, drying at 180 degrees Celsius was performed for 1 min. Further, a para diethylbenzene solution of polythiophene was applied by a relief printing method between the source electrode and the drain electrode for an organic semiconductor layer.

This substrate was arranged on a substrate holder, and drying was performed by a washing and drying apparatus shown in FIG. 4. 1,1,1,3,3-pentafluoro butane was used for a drying solvent. Ultrasonic washings of 26 kHz, 45 kHz and 100 kHz using a drying solvent of 25 degrees Celsius were respectively performed for 5 min. Dipping in a rinse tank filled with a drying solvent of 15 degrees Celsius was performed for 10 min. Exposing to a vapor in a vapor bath was performed for 3 min. Further, the processed of the rinse tank and the vapor bath were repeated 3 times.

An isopropyl alcohol solution of polyvinyl phenol was applied to the dried substrate by a spin coating method for a gate insulating layer. Thereafter, drying at 100 degrees Celsius was performed for 30 min. Finally, Al was deposited to 30 nm thickness by a vapor deposition using a mask. Thereby, a top gate type thin film transistor was manufactured.

The manufactured organic thin film transistor showed a good Vd-Id characteristic and a good Vg-Id characteristic. The mobility was about $5 \times 10^{-4}$ $cm^2/Vs$. Concentrations of para diethylbenzene and 1,1,1,3,3-pentafluoro butane were less than 0.1 ppm (less than a detection limit).

Comparative Example 3

A thin film transistor was manufactured by the same processes as Example 12 except for the following point: heating by an oven of 100 degrees Celsius was performed for 30 min. in a drying process after an applying of a para diethylbenzene solution of polythiophen.

The mobility of the obtained organic thin film transistor was about $3 \times 10^{-4}$ $cm^2/Vs$. Concentration of para diethylbenzene in an organic functional layer was 50 ppm.

Example 13

A polyethylenenaphthalate (PEN) film was used for a substrate 501. $SiO_2$ was deposited to 30 nm thickness for an inorganic insulating layer. Further, an Ag nano ink was applied to a substrate by a relief printing method, thereby a source electrode and a drain electrode were formed. Thereafter, drying at 180 degrees Celsius was performed for 1 min. Further, a para diethylbenzene solution of polythiophene was applied by a relief printing method between the source electrode and the drain electrode for an organic semiconductor layer.

This substrate 501 was arranged on a substrate installing part 601 which supported an end surface of the substrate. Drying was performed by a drying apparatus shown in FIG. 6. 1,1,1,3,3-pentafluoro butane was used for a drying solvent. A square spray nozzle (a product of IKEUCHI co., Ltd.) was used for a cool liquid discharging part 602. A back surface of the substrate 501 was directly cooled by a drying solvent (a cool liquid) 603 for 30 min. while the substrate 501 was exposed to a drying solvent (a vapor) 409, wherein the back surface of the substrate 501 was an opposite surface of a coated film side.

An isopropyl alcohol solution of polyvinyl phenol was applied to the dried substrate 501 by a spin coating method for a gate insulating layer. Thereafter, drying at 100 degrees Celsius was performed for 30 min. Finally, Al was deposited to 30 nm thickness by a vapor deposition using a mask. Thereby, a top gate type thin film transistor was manufactured.

The manufactured organic thin film transistor showed a good Vd-Id characteristic and a good Vg-Id characteristic. The mobility was about $5 \times 10^{-4}$ cm$^2$/Vs. Concentrations of para diethylbenzene and 1,1,1,3,3-pentafluoro butane were less than 0.1 ppm (less than a detection limit).

Comparative Example 4

A thin film transistor was manufactured by the same process as Example 13 except for the following point: in a drying process after applying a para diethylbenzene solution of polythiophene, a substrate installing part 601 was cooled by a cooling part comprised of a box made of SUS316 in which a cooling water of 23 degrees Celsius circulated, instead of cooling by discharging a cooling liquid. In addition, in a drying process, a film substrate 501 bent, and a film substrate 501 was not sufficiently in contact with a cooling part of a substrate installing part 601. Therefore, when about 3 min. passed from starting of exposing to a drying solvent (a vapor) 409, a dew formation of 1,1,1,3,3-pentafluoro butane on a substrate 501 was not observed.

The mobility of the obtained organic thin film transistor was $1 \times 10^{-4}$ cm$^2$/Vs. Concentration of para diethylbenzene in an organic functional layer was 200 ppm, and that of 1,1,1,3, 3-pentafluoro butane was less than 0.1 ppm (less than a detection limit).

Table 2 shows physical property values of drying solvents used in the above respective Examples and those of drying solvents usable in some cases other than the above respective Examples. Conditions are 1 atm (pressure) and 20 degrees Celsius (temperature). As shown in Table 2, drying solvents used in Examples satisfy conditions needed in Claim 1.

In the above Examples, it was shown that an amount of a remaining solvent in an organic thin film can be reduced to about 1 ppm by a drying process in the present invention. It is thought that an acceptable range of an amount of a remaining solvent changes according to a structure or a material of an organic functional device, a method for manufacturing an organic functional device and the purpose of use of an organic functional device. It is thought that an organic EL device is one of products of which driving condition are strictest, wherein the organic El device is driven by oxidation-reduction reactions frequently repeated in an organic layer.

On the other hand, in Example 6, an acceptable range of an amount of a remaining solvent of the organic El device was about 1 ppm. In addition, it was confirmed that if a processing time is a predetermined time or more, a method of the present invention can remove a remaining solvent more than a conventional method. Therefore, it is understood that any organic functional solvents can be sufficiently dried in the case where an organic functional layer is dried by a method of the present invention.

TABLE 1 physical property values of respective solvents

| Solvent name | Boiling point (° C.) | vapor pressure (Pa) | Surface tension (mN/m) |
|---|---|---|---|
| Heptafluoro propyl methylic ether | 34 | 64600 | 12.4 |
| Nona fluorobutyl methyl ether | 61 | 28000 | 13.6 |
| Nona fluorobutyl ethyl ether | 76 | 16000 | 13.6 |
| Trideca fluoro hexyl methylic ether | 98 | 6000 | 15.0 |
| 1,1,2,2,3,3,4-heptafluoro cyclopentane | 82.5 | 8000 | 20.3 |
| 1,1,1,3,3-pentafluoro butane | 40.2 | 47000 | 15 |
| Hexane | 68-70 | 13000-20700 | 17.9 |
| Toluene (reference value) | 110.6 | 2900 | 27.9 |
| Para diethylbenzene (reference value) | 183 | 234 | 29 |
| Paradichlorobenzene (reference value) | 174.1 | 170 | 30.7 |

INDUSTRIAL APPLICABILITY

The present invention can be used for a method for manufacturing an organic functional device by a printing method and be used for an apparatus for the method. Further, the present invention can be used for a method for manufacturing an organic EL device, an organic solar cell and an organic thin film transistor.

What is claimed is:

1. A method for manufacturing an organic functional layer, comprising the steps of:
    forming a coated film of an organic functional material by applying a coating liquid to a substrate by a printing method, the coating liquid including an organic functional material dissolved or dispersed in a first organic solvent;
    bringing the coated film into contact with vapor or liquid of a second organic solvent, and
    removing the first organic solvent inside the coated film, the second organic solvent having the following properties:
    (1) chemically non-active;
    (2) the second organic solvent can be mixed with the first solvent;
    (3) the second organic solvent can not substantially dissolve the organic functional material; and
    (4) a vapor pressure of the second organic solvent is higher than that of the first organic solvent at a room temperature,
    wherein the step of forming the coating film includes a relief printing type offset printing method or an ink-jet printing method, wherein the first organic solvent is a mixed solvent of 50% toluene and 50 para diethylbenzene, and wherein the second organic solvent is ethyl nona fluorobutyl ether.

2. The method for manufacturing an organic functional layer according to claim 1, wherein the step of bringing the coated film into contact with vapor or liquid of the second organic solvent includes a step of dipping the substrate in a rinse bath, the bath filled with the liquid second organic solvent, and a step of bringing the coated film into contact with the vapor of the second organic solvent.

3. The method for manufacturing an organic functional layer according to claim 1, wherein the step of bringing the coated film into contact with the vapor or liquid of the second organic solvent includes a step of spraying a mist of the second organic solvent to the substrate.

4. The method for manufacturing an organic functional layer according to claim 1, further comprising a step of heating the substrate after the step of bringing the coated film into contact with the vapor or liquid of the second organic solvent, in which both steps are performed in an identical space filled with a non-active gas.

5. The method for manufacturing an organic functional layer according to claim 1, wherein the step of bringing the coated film into contact with the vapor or liquid of the second organic solvent is a step of bringing the coated film into contact with the vapor of the second organic solvent, and wherein the method further comprises a step of bringing a fluid including the second organic solvent into contact with a back surface of the substrate, the back surface being an opposite surface to a surface where the coated film is formed, or into contact with a substrate installing part in contact with the back surface.

6. The method for manufacturing an organic functional layer according to claim 5, wherein the following two steps are performed simultaneously:

the step of bringing the coated film into contact with the vapor of the second organic solvent; and the step of bringing a fluid including the second organic solvent into contact with a back surface of the substrate, the back surface being an opposite surface to a surface where the coated film is formed, or into contact with a substrate installing part in contact with the back surface.

7. The method for manufacturing an organic functional layer according to claim 5, wherein a temperature of the second organic solvent used in the following step is more than a dew point of an ambient gas in a place where the substrate is installed, and is lower than a boiling point of the second organic solvent: the step of bringing a fluid including the second organic solvent into contact with a back surface of the substrate, the back surface being an opposite surface to a surface where the coated film is formed, or into contact with a substrate installing part contact with the back surface.

8. The method for manufacturing an organic functional layer according to claim 5, wherein the second organic solvent and a chemically nonactive gas are simultaneously brought into contact with the back surface or the substrate installing part in the following step: the step of bringing a fluid including the second organic solvent into contact with a back surface of the substrate, the back surface being an opposite surface to a surface where the coated film is formed, or into contact with a substrate installing part contact with the back surface.

9. The method for manufacturing an organic functional layer according to claim 1, wherein a change of a surface roughness Ra of the organic functional layer from a time when the organic functional layer is dipped in the liquid second organic solvent to a time when 24 hours passed is less than 1%, and wherein a weight of the organic functional layer which is dissolved in the second organic solvent after 24 hours has passed is less than 0.1% of a weight of the organic functional layer after a dry processing.

10. The method for manufacturing an organic functional layer according to claim 1, wherein a surface tension of the second organic solvent is equal to or less than 25 mN/m.

11. The method for manufacturing an organic functional layer according to claim 1, wherein a molecule in the second organic solvent has 5 or more fluorine atoms.

12. A method for manufacturing an organic functional device, comprising:

forming at least one layer of an organic functional layer included in an organic functional device by a method for manufacturing a functional layer according to claim 1.

* * * * *